(12) United States Patent
Kameyama et al.

(10) Patent No.: US 7,869,480 B2
(45) Date of Patent: Jan. 11, 2011

(54) SEMICONDUCTOR LASER DEVICE

(75) Inventors: Shingo Kameyama, Ibaraki (JP);
Yasuhiko Nomura, Osaka (JP);
Masayuki Hata, Kadoma (JP); Kyoji Inoshita, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 89 days.

(21) Appl. No.: 12/126,365

(22) Filed: May 23, 2008

(65) Prior Publication Data
US 2008/0291958 A1 Nov. 27, 2008

(30) Foreign Application Priority Data

| May 24, 2007 | (JP) | ............................. 2007-138351 |
| May 16, 2008 | (JP) | ............................. 2008-129311 |

(51) Int. Cl.
*H01S 3/04* (2006.01)
(52) U.S. Cl. ................................. 372/43.01; 372/44.01
(58) Field of Classification Search ............... 372/43.01
See application file for complete search history.

(56) References Cited

U.S. PATENT DOCUMENTS

2003/0165169 A1   9/2003   Nomoto et al.
2007/0064758 A1   3/2007   Kuramoto et al.

FOREIGN PATENT DOCUMENTS

| JP | 58-33885 A | 2/1983 |
| JP | 2001015861 A | 1/2001 |
| JP | 2001274501 A | 10/2001 |
| JP | 2003-31895 A | 1/2003 |
| JP | 2003017793 A | 1/2003 |
| JP | 200337323 A | 2/2003 |
| JP | 2003158328 A | 5/2003 |
| JP | 2003174114 A | 6/2003 |
| JP | 2003-258370 A | 9/2003 |
| JP | 2005072052 A | 3/2005 |
| JP | 2006041085 A | 2/2006 |
| JP | 200781283 A | 3/2007 |
| JP | 2007053243 A | 3/2007 |
| JP | 2007103542 A | 4/2007 |

*Primary Examiner*—Tod T Van Roy
(74) *Attorney, Agent, or Firm*—Ditthavong Mori & Steiner, P.C.

(57) ABSTRACT

In a semiconductor laser device, a semiconductor laser element is so fixed to a base that a distance between a convex side of a warp of the semiconductor laser element and the base varies with the warp of the semiconductor laser element along a first direction corresponding to an extensional direction of a cavity while a wire bonding portion is provided around a portion of an electrode layer corresponding to the vicinity of a region where the distance is the largest.

14 Claims, 15 Drawing Sheets

SIMULATION RESULTS ON TEMPERATURE DISTRIBUTION OF HEAT GENERATED IN SEMICONDUCTOR LASER ELEMENT

SIMULATION RESULTS ON TEMPERATURE DISTRIBUTION OF
HEAT GENERATED IN SEMICONDUCTOR LASER ELEMENT

SIMULATION RESULTS ON TEMPERATURE DISTRIBUTION OF
HEAT GENERATED IN SEMICONDUCTOR LASER ELEMENT

SEMICONDUCTOR LASER DEVICE

CROSS-REFERENCE TO RELATED APPLICATIONS

The priority application number JP2007-138351, Semiconductor Laser Device, May 24, 2007, Shingo Kameyama, et al., JP2008-129311, Semiconductor Laser Device, May 16, 2008, Shingo Kameyama, et al., upon which this patent application is based is hereby incorporated by reference.

BACKGROUND OF THE INVENTION

1. Field of the Invention

The present invention relates to a semiconductor laser device, and more particularly, it relates to a semiconductor laser device comprising a semiconductor laser element fixed to a base.

2. Description of the Background Art

A low-output nitride-based semiconductor laser for reproduction has recently been put into practice as the light source for the next-generation optical disk, while a high-output nitride-based semiconductor laser for high-speed recording is in the process of practicalization. In order to assemble a nitride-based semiconductor laser, a nitride-based semiconductor laser element is die-bonded to a seat of a metal stem through a submount with a conductive bonding layer of gold (Au), tin (Sn) or the like, and thereafter wire-bonded with gold. Thereafter the nitride-based semiconductor laser element is sealed with a cap transmitting a laser beam. In general, the side of the nitride-based semiconductor laser element provided with a gallium nitride substrate is die-bonded to the seat of the metal stem.

In a conventional nitride-based semiconductor laser, however, a nitride-based semiconductor layer is formed on a substrate of sapphire, silicon or silicon carbide by epitaxially growing a nitride-based semiconductor, and hence a semiconductor laser element is warped due to the differences between the thermal expansion coefficients and the lattice constants of the substrate and the nitride-based semiconductor layer.

In relation to this, a method of manufacturing a semiconductor laser device in consideration of a warp of a semiconductor laser element is known in general, as disclosed in Japanese Patent Laying-Open No. 2003-31895, for example.

The aforementioned Japanese Patent Laying-Open No. 2003-31895 proposes a method of manufacturing a semiconductor laser device by die-bonding a semiconductor light-emitting device chip to a mount member provided with a curved mount surface having a prescribed radius of curvature and a collet provided with a curved pressing surface also having the prescribed radius of curvature for pressing the die-bonded semiconductor light-emitting device chip from above. Thus, the semiconductor light-emitting device chip is fixed to the mount member in a state warped in a prescribed direction.

According to a conventional semiconductor laser device and the method of manufacturing the same disclosed in Japanese Patent Laying-Open No. 2003-31895, however, the semiconductor light-emitting device chip (semiconductor laser element) is die-bonded to the mount member (base) in the state warped in the prescribed direction with the mount member and the collet provided with the curved surfaces each having the prescribed radius of curvature, and hence it is difficult to cope with dispersion in the warp of each semiconductor light-emitting device chip. If the semiconductor light-emitting device chip has a warp different from the shape of the curved surface of the mount member due to dispersion in the warp thereof, stress is disadvantageously caused in the semiconductor light-emitting device chip when the warp of the semiconductor light-emitting device chip mounted on the mount member is corrected in response to the shape of the curved surface of the mount member. Consequently, laser characteristics are deteriorated, and the semiconductor light-emitting device chip is broken. Particularly when a nitride-based semiconductor laser is formed with a high output, a warp of a device chip and dispersion in the warp are increased due to a long cavity length (length of the device chip), disadvantageously easily leading to the aforementioned problems.

SUMMARY OF THE INVENTION

A semiconductor laser device according to an aspect of the present invention comprises a semiconductor laser element having a warp along a first direction corresponding to an extensional direction of a cavity, an electrode layer formed on a surface of a concave side of the warp of the semiconductor laser element and provided with a wire bonding portion and a base to which a convex side of the warp of the semiconductor laser element is fixed, wherein the semiconductor laser element is so fixed to the base that a distance between the convex side of the warp of the semiconductor laser element and the base varies with the warp of the semiconductor laser element along the first direction while the wire bonding portion is provided around a portion of the electrode layer corresponding to the vicinity of a region where the distance is the largest. In the aforementioned aspect, "the largest distance" means not only that the distance between the convex side of the warp of the semiconductor laser element and the base is strictly the largest but also that the aforementioned distance is substantially the largest.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be hereinafter described with reference to the drawings.

First, the structure of a semiconductor laser device 1 according to the present invention is schematically described with reference to FIG. 1, before specifically illustrating the embodiments of the present invention.

Figure 1:
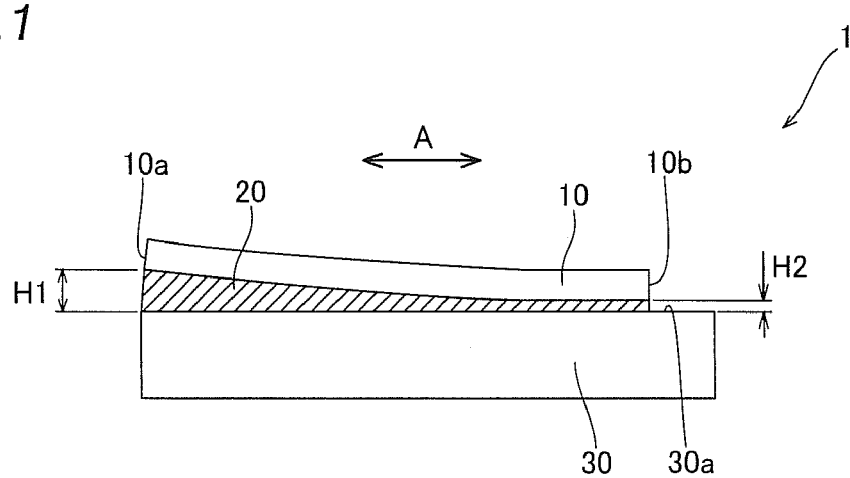
FIG. 1 is a sectional view for schematically illustrating the structure of a semiconductor laser device of the present invention.

In the semiconductor laser device 1 according to the present invention, a semiconductor laser element 10 is fixed to a base 30 through a conductive bonding layer 20 formed by a metal layer or the like, as shown in FIG. 1. The conductive bonding layer 20 is an example of the "fusible layer" in the present invention.

The semiconductor laser element 10 has a warp along the extensional direction (along arrow A) of a cavity. The semiconductor laser element 10 has a light emitting surface 10a and a light reflecting surface 10b provided on both ends in the extensional direction (along arrow A) of the cavity respectively. The light emitting surface 10a is an example of the "light emitting end" in the present invention, and the light reflecting surface 10b is an example of the "light reflecting end" in the present invention.

In the semiconductor laser device 1 according to the present invention, the convex side of the warp of the semiconductor laser element 10 is fixed to the upper surface 30a of the base 30. The semiconductor laser device 1 is so formed that the distance (thickness of the conductive bonding layer 20) H1 between the semiconductor laser element 10 and the base 30 around the light emitting surface 10a of the cavity of the semiconductor laser element 10 is larger than the distance (thickness of the conductive bonding layer 20) H2 between the semiconductor laser element 10 and the base 30 around the light reflecting surface 10b of the semiconductor laser element 10.

The semiconductor laser element 10 can be prepared by forming a semiconductor layer (semiconductor laser element portion) on a substrate such as a gallium nitride substrate, a sapphire substrate, a silicon substrate or a silicon carbide substrate.

Multilayer dielectric films may be formed on the light emitting surface 10a and the light reflecting surface 10b of the semiconductor laser element 10 respectively.

First Embodiment

The structures of a semiconductor laser device 40 according to a first embodiment of the present invention and a semiconductor laser comprising the same will be now described with reference to FIGS. 2 to 7.

Figure 2:
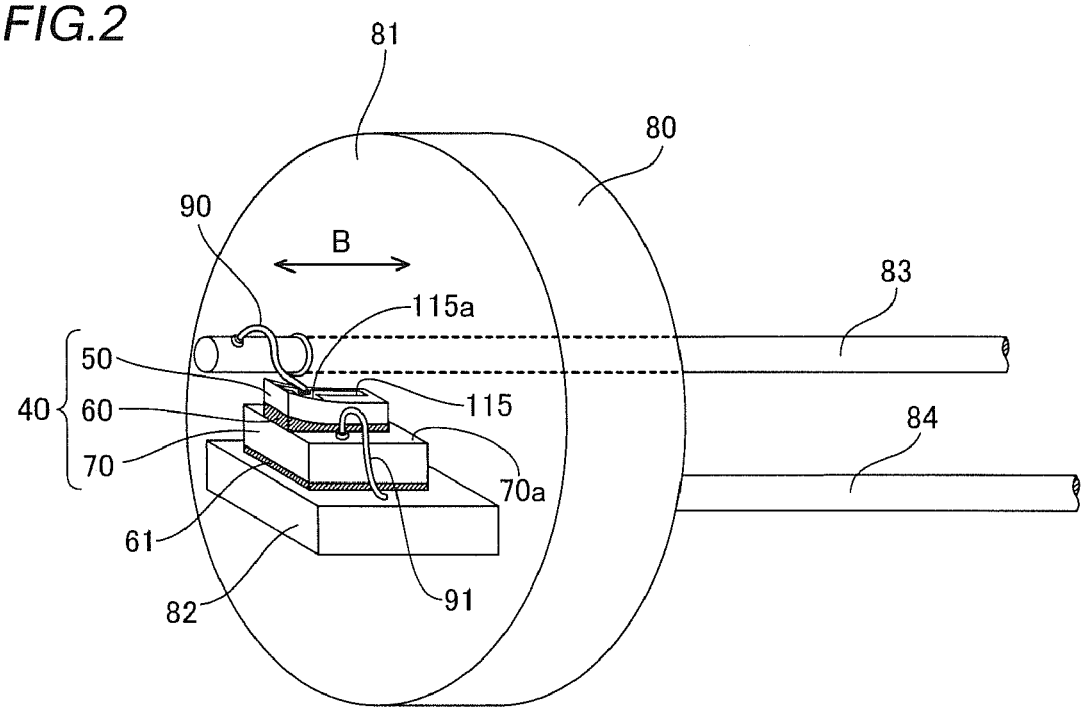
FIG. 2 is a perspective view showing the structure of a semiconductor laser comprising a semiconductor laser device according to a first embodiment of the present invention.
Figure 3:
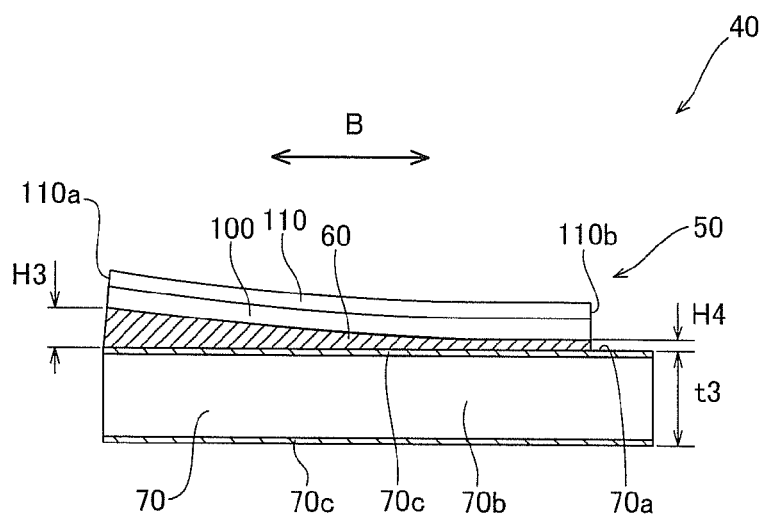
FIG. 3 is a sectional view showing the structure of the semiconductor laser device according to the first embodiment shown in FIG. 2.

In the semiconductor laser comprising the semiconductor laser device 40 according to the first embodiment, a semiconductor laser element 50 is fixed to a base 70 through a conductive bonding layer 60 of AuSn or the like, as shown in FIGS. 2 and 3. The conductive bonding layer 60 is an example of the "fusible layer" in the present invention. The base 70 is fixed to a seat portion 82 provided on a body portion 81 of a metal stem 80 through another conductive bonding layer 61 of AuSn or the like, as shown in FIG. 2. The stem 80 is provided with two lead terminals 83 and 84.

The upper surface of the semiconductor laser element 50 is wire-bonded to the lead terminal 83 of the stem 80 with an Au wire 90, as shown in FIG. 2. The upper surface 70a of the base 70 is wire-bonded to the seat portion 82 of the stem 80 with an Au wire 91. A windowed cap (not shown) transmitting a laser beam is mounted on the body portion 81 of the stem 80.

Figure 4:
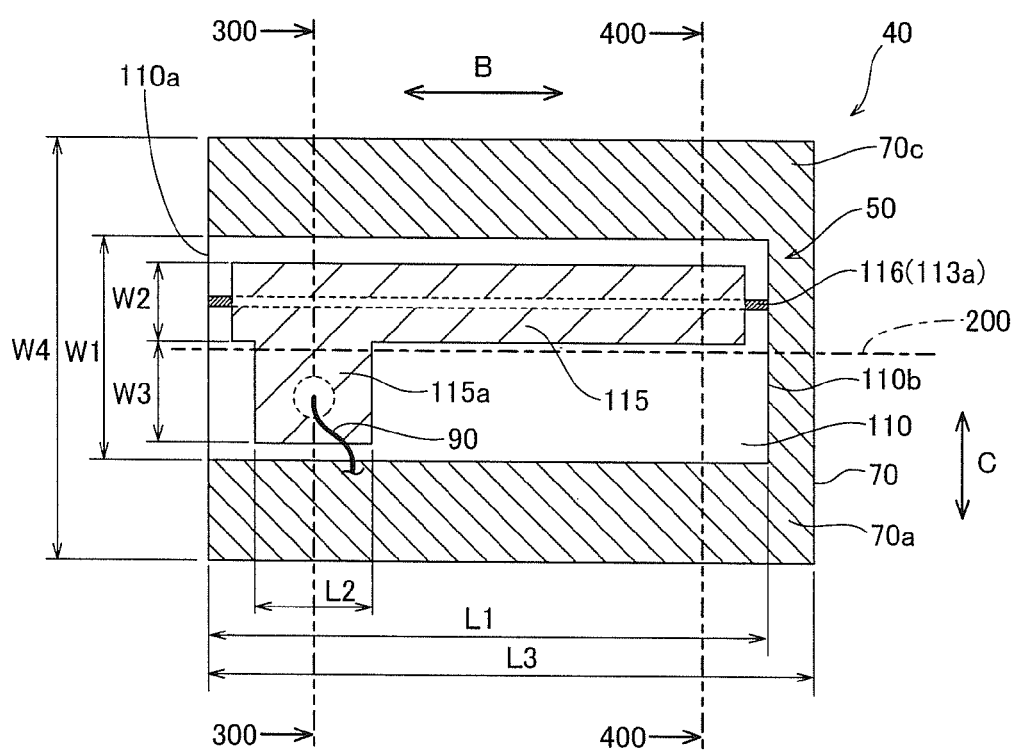
FIG. 4 is a plan view showing the structure of the semiconductor laser device according to the first embodiment shown in FIG. 2.
Figure 5:
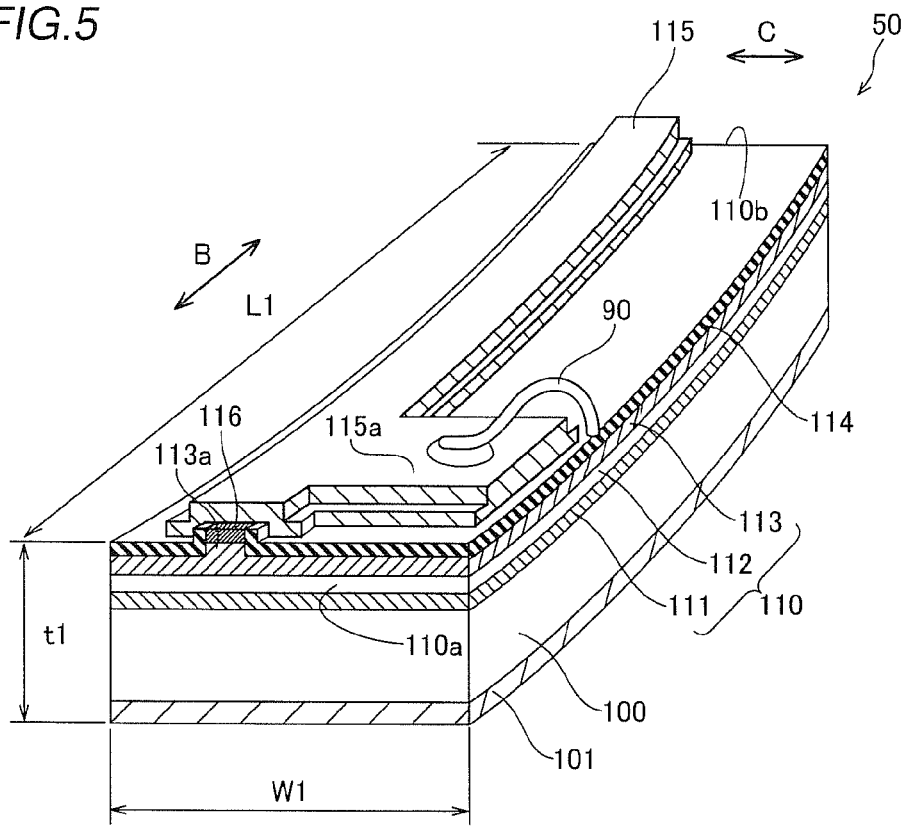
FIG. 5 is a perspective view showing the structure of a semiconductor laser element of the semiconductor laser device according to the first embodiment shown in FIG. 2.

The semiconductor laser element 50 has a width (W1) of about 200 μm, a length (L1) of 1000 mm in the extensional direction (along arrow B) of a cavity and a thickness (t1) (see FIG. 5) of about 100 mm, as shown in FIGS. 4 and 5. The direction B is an example of the "first direction" in the present invention.

According to the first embodiment, the semiconductor laser element 50 is constituted of a substrate 100 arranged on the side of the base 70 and a semiconductor laser element portion 110 arranged on the side opposite to the base 70, as shown in FIG. 3. The substrate 100 is an example of the "substrate" in the present invention.

Figure 6:
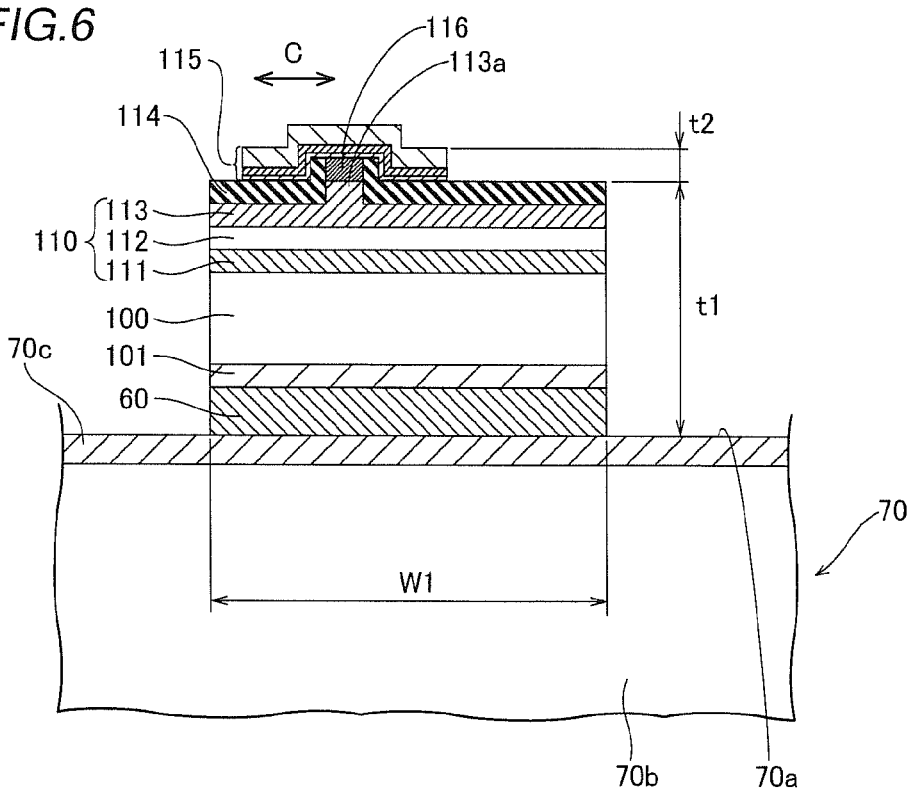
FIG. 6 is a sectional view taken along the line 400-400 in FIG. 4.

More specifically, an n-type AlGaN clad layer 111, an active layer 112 of GaInN and a p-type AlGaN clad layer 113 are formed on the upper surface of the substrate 100 of gallium nitride, silicon or silicon carbide by epitaxial growth, as shown in FIGS. 5 and 6. These nitride-based semiconductor layers, i.e., the n-type AlGaN clad layer 111, the active layer 112 and the p-type AlGaN clad layer 113 constitute the semiconductor laser element portion 110. The n-type AlGaN clad layer 111, the active layer 112 and the p-type AlGaN clad layer 113 are examples of the "nitride-based semiconductor layer" in the present invention. The p-type AlGaN clad layer 113 is provided with a ridge portion 113a extending along arrow B (see FIG. 5), thereby forming a waveguide structure. The ridge portion 113a is so formed as to have a width of about 2 μm. The semiconductor laser element portion 110 is provided with a light emitting surface (cavity facet) 110a and a light reflecting surface (cavity facet) 110b on ends along arrow B respectively, as shown in FIG. 3. The light emitting surface 110a is an example of the "light emitting end" in the present invention, and the light reflecting surface 110b is an example of the "light reflecting end" in the present invention. The light emitting surface 110a, the light reflecting surface 110b and the waveguide structure constitute the cavity extending along arrow B. Multilayer dielectric films (not shown) are formed on the light emitting surface 110a and the light reflecting surface 110b respectively. An insulating film 114 of $SiO_2$ is formed on the upper surface of the p-type AlGaN clad layer 113 excluding the ridge portion 113a, as shown in FIGS. 5 and 6.

An n-side electrode 101 made of an Au film is formed on the lower surface of the substrate 100, as shown in FIGS. 5 and 6. According to the first embodiment, the lower surface of the n-side electrode 101 is die-bonded to the base 70. A p-side electrode 115 made of an Au film is formed on the upper surfaces of the ridge portion 113a of the p-type AlGaN clad layer 113 and the insulating film 114 along the extensional direction (along arrow B) (see FIG. 5) of the ridge portion 113a. An ohmic layer 116 made of a Pt layer having a thickness of about 1 nm, a Pd layer having a thickness of about 30 nm and a Ti layer having a thickness of about 1 nm is formed on the upper portion of the ridge portion 113a in order to reliably electrically connect the ridge portion 113a (clad layer) and the p-side electrode 115 with each other, as shown in FIGS. 5 and 6. The p-side electrode 115 is formed by stacking a Pt layer having a thickness of about 9 nm and a Pd layer having a thickness of about 150 nm, and the outermost surface thereof is covered with an Au film having a thickness of about 5 μm.

As shown in FIG. 4, the p-side electrode 115 has a width (W2) of about 20 mm and a thickness (t2) (see FIG. 6) of about 5.2 μm. The length of the p-side electrode 115 is slightly smaller than the length L1 of the cavity (semiconductor laser element 50).

According to the first embodiment, the semiconductor laser element 50 has a warp of about 0.5 μm to about 3 μm along the extensional direction (along arrow B) of the cavity as shown in FIGS. 3 and 5, depending on the type and the quantity of an additional element in the heterojunction. In the other word, the semiconductor laser element 50 is so warped that an upper surface (first main surface) is concaved and a lower surface (second main surface) is convexed. The surface of the semiconductor laser element portion 110 opposite to the substrate 100 is concaved, and the convex side (provided with the substrate 100) of the warp of the semiconductor laser element 50 is fixed to the base 70 (see FIG. 3). This warp of the semiconductor laser element 50 results from the differences between the thermal expansion coefficients and the lattice constants of the substrate 100 and the semiconductor laser element portion 110.

More specifically, gallium nitride has a thermal expansion coefficient of about $5.59 \times 10^{-6}$/K and a lattice constant of about 0.3189 nm in the a-axis direction respectively as shown in the following Table 1. Silicon has a thermal expansion coefficient of about $2.6 \times 10^{-6}$/K and a lattice constant of about 0.543 nm in the a-axis direction respectively. Silicon carbide has a thermal expansion coefficient of about $4.2 \times 10^{-6}$/K and a lattice constant of about 0.3081 nm in the a-axis direction respectively. AlGaN employed as the main material for the semiconductor laser element portion 110 according to the present invention has a thermal expansion coefficient of about $4.15 \times 10^{-6}$/K to about $5.59 \times 10^{-6}$/K and a lattice constant of about 0.3112 nm to about 0.3189 nm in the a-axis direction respectively. GaInN employed as the material for the active layer 112 of the semiconductor laser element portion 110 according to the present invention has a thermal expansion coefficient of about $3.8 \times 10^{-6}$/K to about $5.59 \times 10^{-6}$/K and a lattice constant of about 0.3189 nm to about 0.3533 nm in the a-axis direction respectively.

TABLE 1

| Material | Thermal Expansion Coefficient ($10^{-6}$/K) a-axis direction | Lattice Constant (nm) a-axis direction | Shape of Surface of Element |
|---|---|---|---|
| AlGaN (Main Material for Element Portion according to the Present Invention) | 4.15~5.59 | 0.3112~0.3189 | |
| GaN (Gallium Nitride Substrate) | 5.59 | 0.3189 | Concave |
| SiC (6H) (Silicon Carbide Substrate) | 4.2 | 0.3081 | Concave |
| Si (Silicon Substrate) | 2.6 | 0.543 | Concave |
| GaInN (Active Layer according to the Present Invention) | 3.8~5.59 | 0.3189~0.3533 | |

If the substrate 100 is made of gallium nitride, the semiconductor laser element 50 is so warped that the side provided with the substrate 100 is convexed (the side provided with the semiconductor laser element portion 110 is concaved) due to the lattice constant, smaller than that of the substrate 100, of the n-type and p-type AlGaN clad layers 111 and 113 constituting the semiconductor laser element portion 110. While the active layer 112 has a larger lattice constant than the substrate 100, the semiconductor laser element 50 is so warped that the side provided with the substrate 100 is convexed conceivably because the thickness of the active layer 112 is smaller than those of the n-type and p-type AlGaN clad layers 111 and 113. If the substrate 100 is made of silicon or silicon carbide, on the other hand, the semiconductor laser element 50 is so warped that side provided with the substrate 100 is convexed (the side provided with the semiconductor laser element portion 110 is concaved) conceivably because the thermal expansion coefficients of the n-type AlGaN clad layer 111, the active layer 112 and the p-type AlGaN clad layer 113 constituting the semiconductor laser element portion 110 are larger than that of the substrate 100.

According to the first embodiment, the semiconductor laser element 50 is so fixed to the base 70 through the conductive bonding layer 60 that the distance between the convex side (provided with the substrate 100) of the warp of the semiconductor laser element 50 and the base 70 varies with the warp of the semiconductor laser element 50 along the extensional direction (along arrow B) of the cavity, as shown in FIG. 3.

More specifically, the conductive bonding layer 60 of AuSn or the like is so formed that the distance H3 (thickness of the conductive bonding layer 60: about 3 μm) between the semiconductor laser element 50 and the base 70 around the light emitting surface 110*a* of the cavity of the semiconductor laser element 50 is larger than the distance H4 (thickness of the conductive bonding layer 60: about 1 μm) between the semiconductor laser element 50 and the base 70 around the light reflecting surface 110*b* of the cavity of the semiconductor laser element 50 for fixing the side of the semiconductor laser element 50 provided with the substrate 100 to the base 70 through the conductive bonding layer 60, as shown in FIG. 3. According to the first embodiment, solder is employed as the material for the conductive bonding layer 60.

As shown in FIG. 6, the conductive bonding layer 60 has the same width (W1=about 200 μm) and the same length (L1=about 1000 μm) (see FIG. 5) as the semiconductor laser element 50, and a thickness of about 1 to 5 μm (maximum value) described above.

As shown in FIG. 3, the conductive bonding layer around the light reflecting surface 110*b* of the semiconductor laser element 50 is arranged substantially parallelly to the upper surface 70*a* of the base 70. In other words, the semiconductor laser element 50 is so arranged that the direction of a laser beam reflected on the light reflecting surface 110*b* toward the inside of the cavity is substantially parallel to the extensional direction of the upper surface 70*a* of the base 70.

According to the first embodiment, a wire bonding portion 115*a* provided on the p-side electrode 115 of the semiconductor laser element 50 is arranged on the upper surface of the insulating film 114 around the light emitting surface 110*a*, as shown in FIGS. 4 and 5. In other words, the wire bonding portion 115*a* is provided on a portion of the p-side electrode 115 corresponding to the vicinity of a region (where the conductive bonding layer 60 substantially has the thickness H3 (see FIG. 3)) where the distance between the semiconductor laser element 50 and the base 70 is substantially the largest. The wire bonding portion 115*a* has a width (W3) of about 80 μm to about 90 μm, a length (L2) of about 50 μm to about 60 μm along arrow B and a thickness (t2) (see FIG. 7) of about 5.2 μm identical with that of the p-side electrode 115, as shown in FIG. 4.

Figure 7:
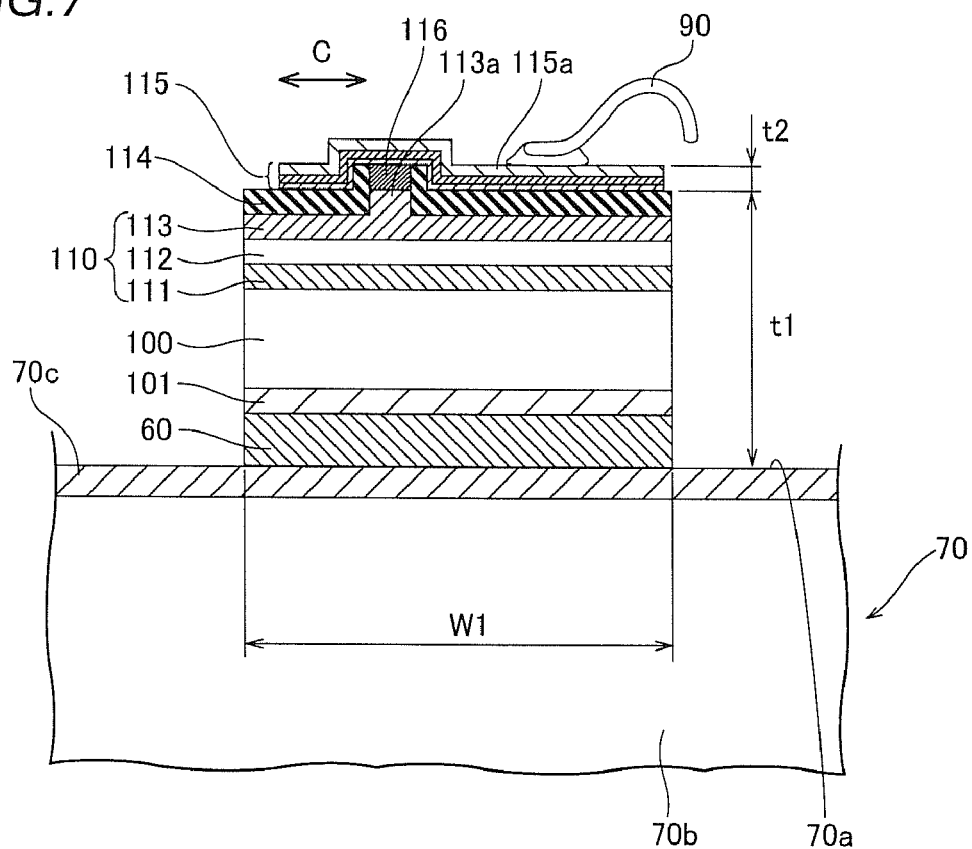
FIG. 7 is a sectional view taken along the line 300-300 in FIG. 4.

According to the first embodiment, the ridge portion 113*a* and the p-side electrode 115 of the semiconductor laser element 50 are so formed as to extend substantially parallelly to a centerline 500 (shown by a one-dot chain line) (see FIG. 4) of the cavity of the semiconductor laser element 50 in the cross direction (along arrow C) at a prescribed distance (about 20 μm) from the centerline 500, as shown in FIGS. 4, 5 and 7. The wire bonding portion 115*a* protrudes from the p-side electrode 115 formed immediately above the ridge portion 113*a* through the ohmic layer 116 in the cross direction (along arrow C) of the semiconductor laser element 50, and is provided on the upper surface of the insulating film 114 in the region provided with no ridge portion 113*b* across the centerline 500 (see FIG. 4).

The base 70 has a width (W4) of about 900 μm, a length (L3) of about 1200 μm and a thickness (t3) (see FIG. 3) of about 250 μm, as shown in FIG. 4.

The base 70 includes a substrate 70*b* of SiC or AlN, as shown in FIGS. 3 and 6. A metal underlayer 70*c* made of a Ti layer having a thickness of about 100 nm, a Pt layer having a thickness of about 20 nm and an Au layer having a thickness of about 30 nm is formed on the overall upper and lower surfaces of the substrate 70*b*. This metal underlayer 70*c* is provided for bonding the conductive bonding layer 60 to the base 70.

A manufacturing process for the semiconductor laser comprising the semiconductor laser device 40 according to the first embodiment will be now described with reference to FIGS. 2, 3, 5 and 8.

First, the semiconductor laser element portion 110 is formed by epitaxially growing the n-type AlGaN clad layer 111, the active layer 112 of GaInN and the p-type AlGaN clad layer 113 on the upper surface of the substrate 100, as shown in FIG. 5. Then, the ridge portion 113*a* extending along arrow B is formed on the p-type AlGaN clad layer 113, and the insulating film 114 of $SiO_2$ is thereafter formed on the upper surface of the p-type AlGaN clad layer 113 excluding the ridge portion 113*a*. Thereafter the n-side electrode 101 made of the Au film is formed on the lower surface of the substrate 100, while the ohmic layer 116 made of the Pt layer, the Pd layer and the Ti layer is formed on the upper surface of the ridge portion 113*a* of the p-type AlGaN clad layer 113. Then, the p-side electrode 115 having the outermost surface made of the Au film is formed on the upper surfaces of the ohmic layer 116 and the insulating film 114. Then, the multilayer dielectric films (not shown) are formed on the light emitting surface 110*a* and the light reflecting surface 110*b* of the semiconductor laser element portion 110 respectively, thereby forming the semiconductor laser element 50. At this time, the semiconductor laser element 50 is so warped that the side provided with the substrate 100 is convexed (the side provided with the semiconductor laser element portion 110 is concaved) due to the differences between the thermal expansion coefficients and the lattice constants of the substrate 100 and the semiconductor laser element portion 110, as shown in FIG. 5.

According to the first embodiment, the convex side (provided with the substrate 100) of the warp of the semiconductor laser element 50 is thereafter so die-bonded to the base 70 that the distance H3 (thickness of the conductive bonding layer 60: about 3 μm) between the semiconductor laser element 50 and the base 70 around the light emitting surface 110*a* of the cavity of the semiconductor laser element 50 is larger than the distance H4 (thickness of the conductive bonding layer 60: about 1 μm) between the semiconductor laser element 50 and the base 70 around the light reflecting surface 110*b* of the cavity of the semiconductor laser element 50, as shown in FIG. 3. At the same time, the base 70 is fixed to the seat portion 82 (see FIG. 2) of the stem 80.

Figure 8:
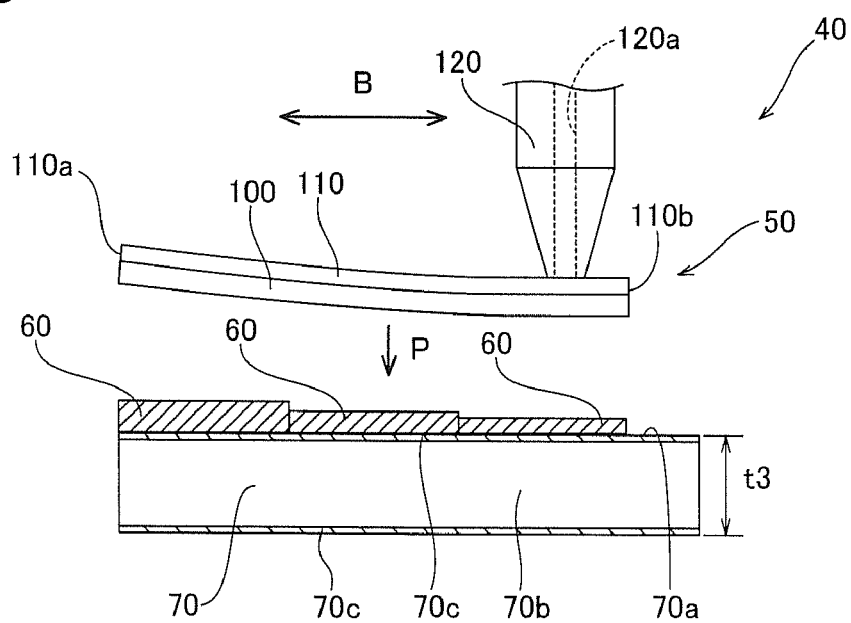
FIG. 8 is a diagram for illustrating a manufacturing process for the semiconductor laser comprising the semiconductor laser device according to the first embodiment of the present invention.

More specifically, the conductive bonding layer 61 (see FIG. 2), the base 70 having the conductive bonding layer 60 arranged on a prescribed region and the semiconductor laser element 50 are successively arranged on the seat portion 82 (see FIG. 2) of the metal stem 80 (see FIG. 2) in a nitrogen atmosphere, as shown in FIG. 8.

According to the first embodiment, the conductive bonding layer 60 is so arranged on the upper surface 70*a* of the base 70 that the thickness thereof changes in three ways (three stages) in the longitudinal direction (along arrow B) of the cavity, as shown in FIG. 8. In other words, the conductive bonding layer 60 of solder is so arranged on the upper surface 70a of the base 70 that the thickness thereof increases stepwise from around the light reflecting surface 110b toward the light emitting surface 110a.

According to the first embodiment, the stem 80 (see FIG. 2) is heated to a high temperature, and a portion of the semiconductor laser element 50 around the light reflecting surface 110b is pressed with a collet 120 of ceramic toward the base 70 along arrow P through the conductive bonding layer 60, as shown in FIG. 8. When the portion of the semiconductor laser element 50 around the light emitting surface 110a is pressed with the collet 120, the region (around the light reflecting surface 110b of the semiconductor laser element 50) of the conductive bonding layer 60 pressed with the collet 120 is fused to move to another region (around the light emitting surface 110a of the semiconductor laser element 50) not pressed with the collet 120, while the region of the conductive bonding layer 60 between the portion of the semiconductor laser element 50 around the light emitting surface 110a and the base 70 is also fused due to thermal conduction. Consequently, the thickness of the conductive bonding layer 60 varies from the H4 to H3 with the warp of the semiconductor laser element 50, as shown in FIG. 3. In other words, the warp of the semiconductor laser element 50 is not corrected but the thickness of the conductive bonding layer 60 varies with the warp of the semiconductor laser element 50 according to the first embodiment. The collet 120 is provided with a hole 120a, and can adsorb the semiconductor laser element 50 by evacuating the hole 120a.

The conductive bonding layer 61 (see FIG. 2) held between the seat portion 82 (see FIG. 2) heated to the high temperature along with the stem 80 (see FIG. 2) and the base 70 (see FIG. 2) is also fused by thermal conduction.

Thereafter the stem 80 is cooled for solidifying the conductive bonding layers 60 and 61 so that the semiconductor laser element 50 is fixed to the base 70 through the conductive bonding layer 60 and the base 70 is fixed to the seat portion 82 of the stem 80 through the conductive bonding layer 61, as shown in FIG. 2.

The wire bonding portion 115a of the semiconductor laser element 50 and the lead terminal 83 of the stem 80 are connected with each other by wire bonding through the Au wire 90, while the upper surface 70a of the base 70 and the seat portion 82 of the stem 80 are connected with each other by wire bonding through the Au wire 91. Finally, the windowed cap (not shown) transmitting the laser beam is mounted on the body portion 81 of the stem 80.

The semiconductor laser comprising the semiconductor laser device 40 according to the first embodiment is manufactured in the aforementioned manner.

According to the first embodiment, as hereinabove described, the semiconductor laser element 50 is so fixed to the base 70 that the distance between the convex side of the warp of the semiconductor laser element 50 and the base 70 varies with the warp of the semiconductor laser element 50 along the extensional direction (along arrow B) of the cavity, whereby the semiconductor laser element 50 can be fixed to the base 70 with no correction of the warp of the semiconductor laser element 50 itself even if the warp of the semiconductor laser element 50 is dispersed. Thus, the semiconductor laser element 50 can be prevented from excess stress resulting from correction of the warp. Consequently, deterioration of laser characteristics and breakage of the semiconductor laser element 50 (semiconductor laser element portion 110) can be suppressed.

According to the first embodiment, the semiconductor laser element 50 is provided with the wire bonding portion 115a on the portion of the p-side electrode 115 corresponding to the vicinity of the region (where the conductive bonding layer 60 substantially has the thickness H3 (see FIG. 3)) where the distance between the semiconductor laser element 50 and the base 70 is the largest so that the wire bonding portion 115a provided on the region of the semiconductor laser element 50 minimally inclined with respect to the upper surface 70a of the base 70 is wire-bonded with the Au wire 90, whereby heat of the ridge portion 113a generated by emitting a laser beam can be radiated in air on the region (around the light emitting surface 110a) having a larger distance between the semiconductor laser element 50 and the base 70 through the wire bonding portion 115a on the side of the p-side electrode 115 and hence it is possible to obtain radiation performance equivalent to radiation performance from the semiconductor laser element portion 110 to the base 70 on the region (where the conductive bonding layer 60 substantially has the thickness H4 (see FIG. 3)) having a smaller distance between the semiconductor laser element 50 and the base 70. Consequently, temperature distribution of generated heat in the semiconductor laser element 50 can be uniformized.

According to the first embodiment, the semiconductor laser element 50 is fixed to the base 70 through the conductive bonding layer 60 such that the side provided with the substrate 100 is directed toward the base while the conductive bonding layer 60 is so formed that the thickness thereof varies from H4 (about 1 μm) to H3 (about 3 μm) (see FIG. 3) with the warp of the semiconductor laser element 50 along the extensional direction (along arrow B) of the cavity on the region held between the substrate 100 of the semiconductor laser element 50 and the base 70 so that a clearance formed between the substrate 100 of the semiconductor laser element 50 and the base 70 to which the substrate 100 is fixed can be efficiently filled up with the conductive bonding layer 60 having the varying thickness in response to the warp of the semiconductor laser element 50, whereby the semiconductor laser element 50 can be easily fixed to the base 70 with no correction of the warp.

According to the first embodiment, the conductive bonding layer 60 for fixing the semiconductor laser element 50 to the base 70 is constituted of the fusible layer made of solder, whereby the fusible layer having the varying thickness can be easily formed due to the characteristic of fused solder.

According to the first embodiment, the semiconductor laser element 50 includes the semiconductor laser element portion 110 having the nitride-based semiconductor layers such as the n-type AlGaN clad layer 111, the active layer 112 of GaInN and the p-type AlGaN clad layer 113. Also when the semiconductor laser element portion 110 having the nitride-based semiconductor layers easily warped in epitaxial growth is fixed to the base 70, deterioration of the laser characteristics and breakage of the semiconductor laser element portion 110 resulting from correction of the warp can be easily suppressed and temperature distribution of generated heat in the semiconductor laser element portion 110 can be uniformized due to the aforementioned structure according to the first embodiment.

According to the first embodiment, the wire bonding portion 115a is provided around the light emitting surface 110a of the cavity of the semiconductor laser element 50, whereby heat generation resulting from the laser beam partially scattering due to the surface shape (unevenness) of the light emitting surface 110a when emitting the laser beam in the cavity from the light emitting surface 110a can be efficiently diffused (radiated) in air through the wire bonding portion 115a provided around the region (where the conductive bonding layer 60 substantially has the thickness H3 (see FIG. 3)) where the distance between the semiconductor laser element 50 and the base 70 is substantially the largest.

According to the first embodiment, the semiconductor laser element 50 is so arranged that the lower surface (provided with the n-side electrode 101) of the light reflecting surface 110b of the cavity is substantially parallel to the upper surface 70a of the base 70, whereby the direction (position of the light emitting surface 110a) of the laser beam emitted from the semiconductor laser element 50 can be easily identified by measuring the thickness of the conductive bonding layer 60 after bonding the semiconductor laser element 50 to the base 70.

According to the first embodiment, the wire bonding portion 115a is so formed as to protrude from the p-side electrode 115 in the cross direction (along arrow C) of the cavity in plan view, whereby the ridge portion 113a and the ohmic layer 116 can be easily protected against the impact load in wire bonding.

According to the first embodiment, the ridge portion 113a is provided on the upper surface of the semiconductor laser element 50 to extend substantially parallelly to the centerline 500 (shown by the one-dot chain line in FIG. 4) in the cross direction (along arrow C in FIG. 4) of the cavity along the extensional direction (along arrow B) of the cavity at the prescribed distance (about 20 µm) from the centerline 500 and to be connected to the p-side electrode 115 through the ohmic layer 116 while the wire bonding portion 115a is provided on the upper surface of the insulating film 114 (see FIG. 5) in the region provided with no ridge portion 113a so that neither the ridge portion 113a nor the ohmic layer 116 is arranged immediately under the wire bonding portion 115a, whereby the impact load applied to the wire bonding portion 115a from above in wire bonding with the Au wire 90 is not directly applied to the ridge portion 113a and the ohmic layer 116. Thus, the ridge portion 113a and the ohmic layer 116 can be protected against the impact load in wire bonding.

According to the first embodiment, the ridge portion 113a and the wire bonding portion 115a are formed in the directions opposite to each other through the substantially central portion (around the centerline 500) of the semiconductor laser element 50 in the cross direction (along arrow C in FIG. 4) of the cavity, whereby the wire bonding portion 115a can be further approached to the centerline 500 than the ridge portion 113a deviating from the centerline 500 toward one side along arrow C. Thus, the impact load applied to the wire bonding portion 115a from above in wire bonding can be inhibited from biased application in the cross direction (along arrow C in FIG. 4) of the cavity of the semiconductor laser element 50.

A simulation performed for confirming the effects of the aforementioned first embodiment will be now described with reference to FIGS. 3, 4, 9 and 10.

Figure 9:
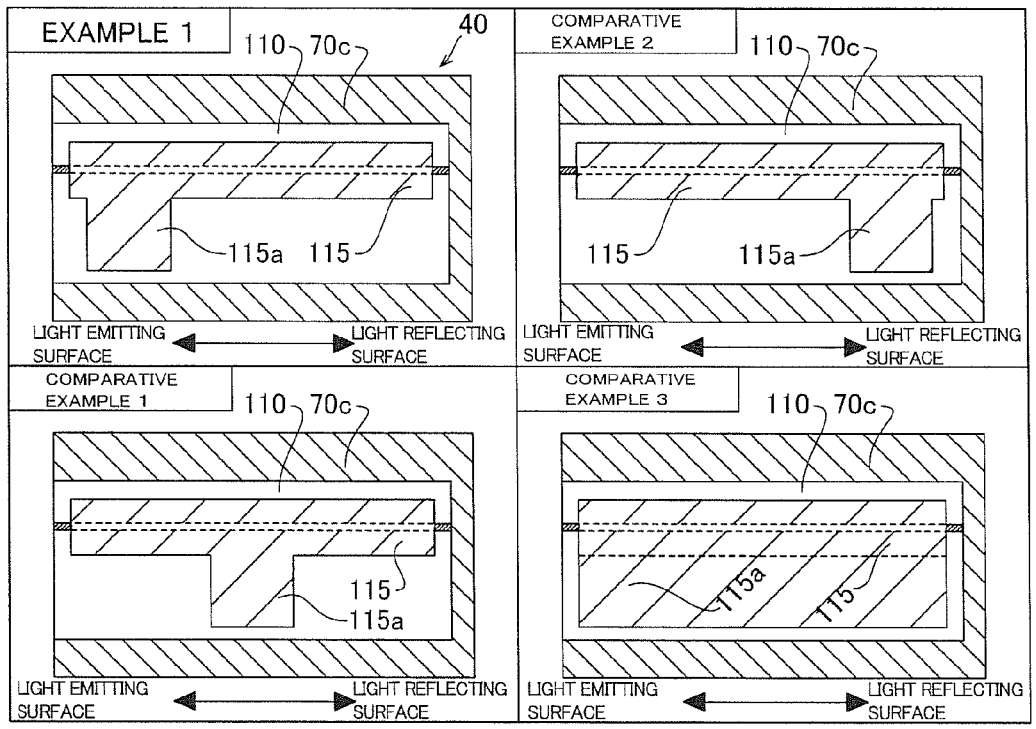
FIG. 9 is a diagram showing positions of wire bonding portions on semiconductor laser elements in simulation for confirming effects of the first embodiment shown in FIG. 4.

In this simulation, a heat dissipation model in an laser operation of a semiconductor laser element 50 (see FIGS. 3 and 4) according to Example 1 corresponding to the aforementioned first embodiment was prepared as shown in FIG. 9. Heat dissipation models in a laser operation of semiconductor laser elements 50 provided with wire bonding portions 115a on positions shown in FIG. 9 respectively were prepared as comparative examples 1 to 3. More specifically, in the heat dissipation model according to comparative example 1, the wire bonding portion 115a was provided around the substantial center in an extensional direction of a cavity. In the heat dissipation model according to the comparative example 2, the wire bonding portion 115a was provided around a position corresponding to a light emitting surface 110a in an extensional direction of a cavity. In the heat dissipation model according to the comparative example 3, the wire bonding portion 115a was arranged on the overall surface along an extensional direction of a cavity. In this simulation, the temperature distribution of generated heat of the semiconductor laser element portions 110 was calculated according to the heat dissipation models considering heat dissipation from the semiconductor laser element portions 110 (see FIG. 3) to bases 70 (see FIG. 3) and heat dissipation in air from the semiconductor laser element portion (see FIG. 3) through the p-side electrodes 115 and the wire bonding portion 115a.

Figure 10:
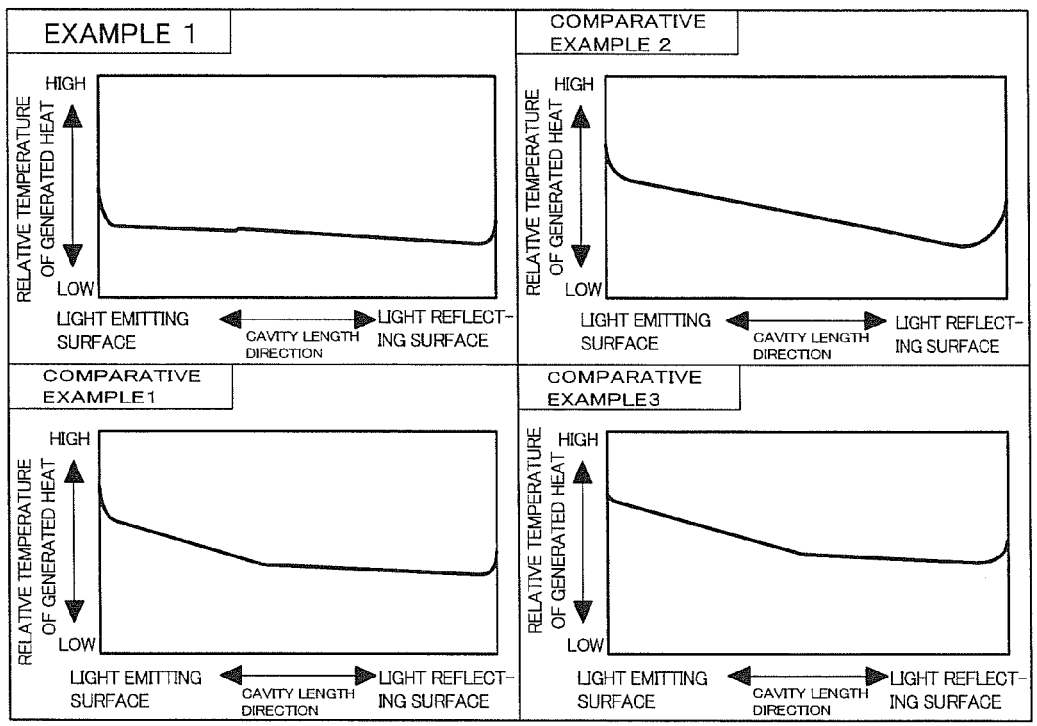
FIG. 10 is a diagram showing results of the simulation performed for confirming the effects of the first embodiment shown in FIG. 4.

The temperature distribution of generated heat of the semiconductor laser element portions in the laser operation in the semiconductor laser elements 50 according to the aforementioned Example 1, and comparative examples 1, 2 and 3 was calculated. FIG. 10 shows these simulation results.

According to comparative examples 1 and 2, the results that temperature distribution of generated heat in the extensional direction of the cavity of the semiconductor laser element portions occurs, as shown in FIG. 10. This is conceivably because radiation performance on the region (around the light emitting surface 110a (see FIG. 3)) where the conductive bonding layer 60 between the semiconductor laser element portion 110 and the base 70 has a large thickness is relatively deteriorated as compared with radiation performance on the region (around the light reflecting surface 110b (see FIG. 3)) where the conductive bonding layer 60 has a small thickness, and hence temperature of heat generated on this region is increased. Also in the comparative example 3, the wire bonding portion 115a is uniformly formed in the extensional direction of the cavity and hence the temperature distribution of generated heat as in the aforementioned comparative examples 1 and 2 can not be improved, and the temperature distribution of generated heat substantially similar to that of the aforementioned comparative examples 1 and 2 were obtained. According to the prediction result, on the other hand, temperature distribution of generated heat in the extensional direction of the cavity was substantially uniform in the aforementioned Example 1. This is conceivably because the wire bonding portion 115a is provided on the region (around the light emitting surface 110a) where the thickness of the conductive bonding layer 60 is large and the radiation performance is relatively deteriorated so that the area where the p-side electrode 115 touches air is increased as compared with other region (around the center of the cavity and the light reflecting surface 110b where the thickness of the conductive bonding layer 60 is relatively small) and hence the radiation performance is improved. It has been confirmed from these results that the temperature distribution of generated heat in the semiconductor laser element 110 can be uniformized in the aforementioned Example 1.

Second Embodiment

Figure 11:
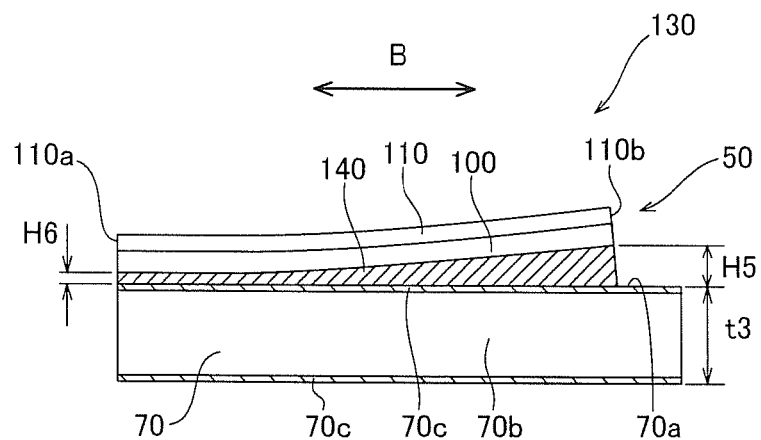
FIG. 11 is a sectional view showing the structure of a semiconductor laser device according to a second embodiment of the present invention.
Figure 12:
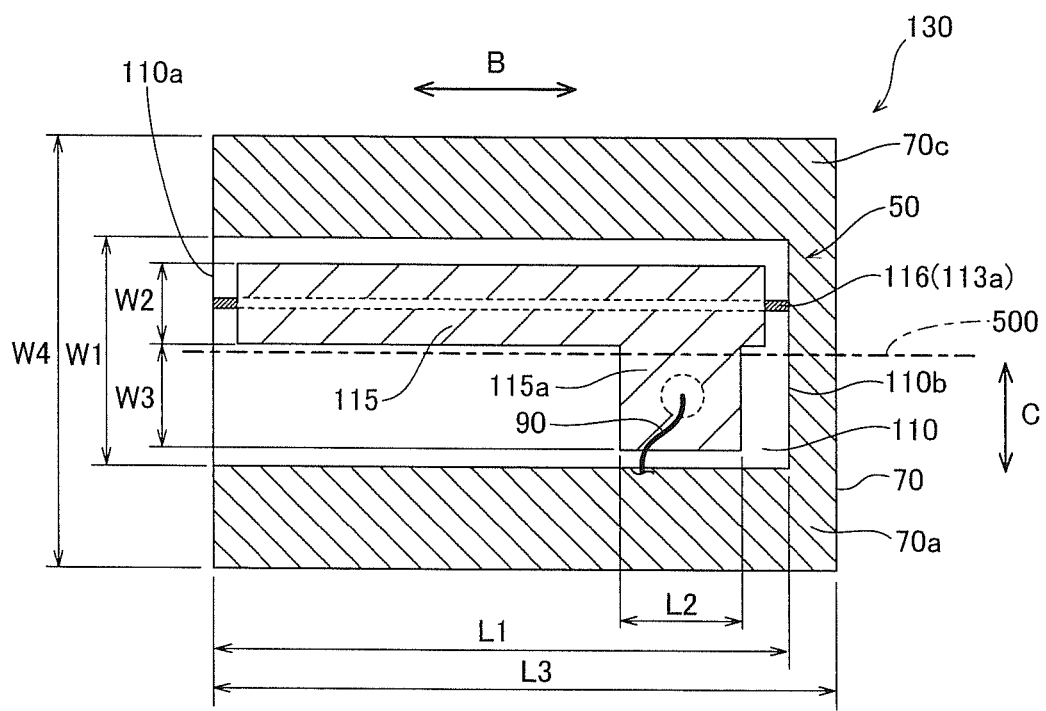
FIG. 12 is a plan view showing the structure of the semiconductor laser device according to the second embodiment shown in FIG. 11.
Figure 13:
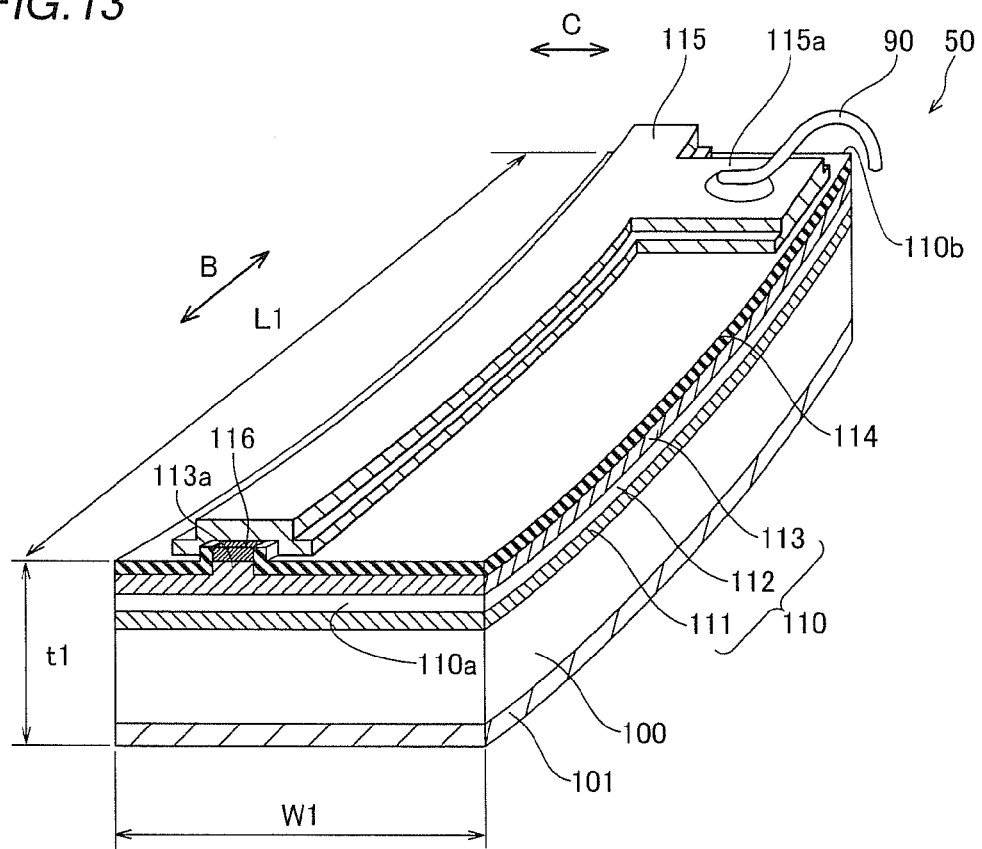
FIG. 13 is a perspective view showing the structure of the semiconductor laser device according to the second embodiment shown in FIG. 11.

Referring to FIGS. 11 to 13, a semiconductor laser element 50 is so fixed to a base 70 that the distance between the semiconductor laser element 50 and the base 70 around a light reflecting surface 110b of a cavity is larger than the distance between the semiconductor laser element 50 and the base 70 around a light emitting surface 110a of the cavity in a semiconductor laser device 130 according to a second embodiment of the present invention, dissimilarly to the aforementioned first embodiment.

In the semiconductor laser device 130 according to the second embodiment, the semiconductor laser element 50 is so fixed to the base 70 through a conductive bonding layer 140 (see FIG. 11) of AuSn or the like that the distance between the convex side (provided with a substrate 100) of a warp of the semiconductor laser element 50 and the base 70 changes along the extensional direction (along arrow B) of the cavity similarly to the aforementioned first embodiment, as shown in FIGS. 11 and 13.

According to the second embodiment, the conductive bonding layer 140 is so formed that the distance H5 (thickness of the conductive bonding layer 140: about 3 μm) between the semiconductor laser element 50 and the base 70 around the light reflecting surface 110b of the cavity of the semiconductor laser element 50 is larger than the distance H6 (thickness of the conductive bonding layer 140: about 1 μm) between the semiconductor laser element 50 and the base 70 around the light emitting surface 110a of the cavity of the semiconductor laser element 50 for fixing the side of the semiconductor laser element 50 provided with the substrate 100 to the base 70 through the conductive bonding layer 140, as shown in FIG. 11.

As shown in FIG. 11, the light emitting surface 110a of the semiconductor laser element 50 is arranged substantially parallelly to the upper surface 70a of the base 70. In other words, the semiconductor laser element 50 is so arranged that the direction of a laser beam emitting on the light emitting surface 110a is substantially parallel to the extensional direction of the upper surface 70a of the base 70.

According to the second embodiment, a wire bonding portion 115a provided on a p-side electrode 115 of the semiconductor laser element 50 is so arranged as to correspond to the vicinity of the light reflecting surface 110b, as shown in FIGS. 12 and 13. In other words, the wire bonding portion 115a is provided on a portion of the p-side electrode 115 corresponding to the vicinity of a region (where the conductive bonding layer 140 substantially has the thickness H5 (see FIG. 11)) where the distance between the semiconductor laser element 50 and the base 70 is substantially the largest.

According to the second embodiment, a ridge portion 113a and the p-side electrode 115 of the semiconductor laser element 50 are provided on the upper surface of a semiconductor laser element portion 110 to extend substantially parallelly to a centerline 500 (shown by a one-dot chain line) (see FIG. 12) of the cavity of the semiconductor laser element 50 in the cross direction (along arrow C) at a prescribed distance (about 20 μm) from the centerline 500, as shown in FIGS. 12 and 13. The wire bonding portion 115a protrudes from the p-side electrode 115 formed immediately above the ridge portion 113a through an ohmic layer 116 in the direction C of the semiconductor laser element 50, and is provided on the upper surface of an insulating film 114 in a region provided with no ridge portion 113b across the centerline 500 (see FIG. 12).

The remaining structure of the semiconductor laser device 130 according to the second embodiment is similar to that of the aforementioned first embodiment.

A manufacturing process for a semiconductor laser comprising the semiconductor laser device 130 according to the second embodiment will be now described with reference to FIGS. 2 and 11 to 14.

First, the semiconductor laser element 50 is formed similarly to the aforementioned first embodiment.

According to the second embodiment, the convex side (provided with the substrate 100) of the warp of the semiconductor laser element 50 is so die-bonded to the base 70 that the distance H5 (thickness of the conductive bonding layer 140: about 3 μm) between the semiconductor laser element 50 and the base 70 around the light reflecting surface 110b of the cavity of the semiconductor laser element 50 is larger than the distance H6 (thickness of the conductive bonding layer 140: about 1 μm) between the semiconductor laser element 50 and the base 70 around the light emitting surface 110a of the cavity of the semiconductor laser element 50, as shown in FIG. 11. At the same time, the base 70 is fixed to a seat portion 82 (see FIG. 2) of a stem 80.

Figure 14:
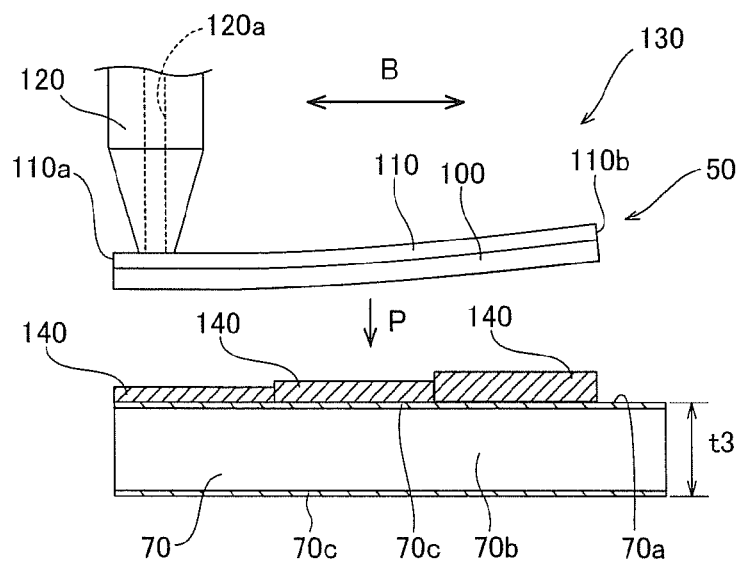
FIG. 14 is a diagram for illustrating a manufacturing process for a semiconductor laser comprising the semiconductor laser device according to the second embodiment of the present invention.

According to the second embodiment, the conductive bonding layer 140 is so arranged on the upper surface 70a of the base 70 that the thickness thereof changes in three ways (three stages) in the longitudinal direction (along arrow B) of the cavity, as shown in FIG. 14. In other words, the conductive bonding layer 140 of solder is so arranged on the upper surface 70a of the base 70 that the thickness thereof increases stepwise from around the light emitting surface 110a (thickness: about 1 μm) toward the light reflecting surface 110b (the thickness around the light reflecting surface 110b is about 3 μm).

The convex side (provided with the substrate 100) of the warp of the semiconductor laser element 50 is die-bonded to the base 70 similarly to the aforementioned first embodiment, as shown in FIG. 14. When a portion of the semiconductor laser element 50 around the light emitting surface 110a is pressed with a collet 120 along arrow P, the region (around the light emitting surface 110a of the semiconductor laser element 50) of the conductive bonding layer 140 pressed with the collet 120 is fused to move to another region (around the light reflecting surface 110b of the semiconductor laser element 50) not pressed with the collet 120, while the region of the conductive bonding layer 140 between the portion of the semiconductor laser element 50 around the light reflecting surface 110b and the base 70 is also fused due to thermal conduction. Consequently, the thickness of the conductive bonding layer 140 varies from H6 to H5 (see FIG. 9) with the warp of the semiconductor laser element 50. In other words, the warp of the semiconductor laser element 50 is not corrected but the thickness of the conductive bonding layer 140 varies with the warp of the semiconductor laser element 50 for fixing the semiconductor laser element 50 to the base 70 also in the second embodiment.

The remaining manufacturing process for the semiconductor laser comprising the semiconductor laser device 130 according to the second embodiment is similar to that of the aforementioned first embodiment. The semiconductor laser comprising the semiconductor laser device 130 according to the second embodiment is manufactured in the aforementioned manner.

According to the second embodiment, as hereinabove described, the wire bonding portion 115a is provided around the light reflecting surface 110b of the cavity of the semiconductor laser element 50, whereby heat of the ridge portion 113a generated from the light reflecting surface 110b partially absorbing the laser beam when reflecting the laser beam in the cavity 115 can be efficiently diffused (radiated) in air through the wire bonding portion 115a provided around the region (where the conductive bonding layer 140 substantially has the thickness H5 (about 3 μm) (see FIG. 11)) where the distance between the semiconductor laser element 50 and the base 70 is substantially the largest. Thus, it is possible to obtain radiation performance equivalent to radiation performance from the semiconductor laser element portion 110 to the base 70 on the region (where the conductive bonding layer 140 substantially has a thickness of H3 (about 1 μm) (see FIG. 11)) having a smaller distance between the semiconductor laser element 50 and the base 70 and hence temperature distribution of heat generated in the semiconductor laser element 50 can be uniformized.

According to the second embodiment, the wire bonding portion 115a is provided around the portion of the p-side electrode 115 corresponding to the vicinity of the region where the distance H5 between the semiconductor laser element 50 and the base 70 around the light reflecting surface 110b of the cavity of the semiconductor laser element 50 is larger than the distance H6 between the semiconductor laser element 50 and the base 70 around the light emitting surface 110a of the cavity of the semiconductor laser element 50, whereby it is possible to recognize that the wire bonding portion 115a is provided on a position around the light reflecting surface 110b of the cavity by planarly observing the formed semiconductor laser element 50. Thus, the direction (position of the light emitting surface 110a) of the laser beam emitted from the semiconductor laser element 50 can be easily identified.

According to the second embodiment, the semiconductor laser element 50 is so arranged that the lower surface (provided with an n-side electrode 101) of the light emitting surface 110a of the cavity is substantially parallel to the upper surface 70a of the base 70, whereby the direction of the laser beam emitted from the light emitting surface 110a can be inhibited from upward inclination with respect to the surface 70a of the base 70. Consequently, the direction of the laser beam emitted from the semiconductor laser element 50 can be inhibited from dispersion, whereby the assembly yield of the semiconductor laser device 40 can be improved.

Also according to the second embodiment, the p-side electrode 115 and the ridge portion 113a are formed on the upper surface of the semiconductor laser element portion to extend substantially parallelly to the centerline 500 (shown by the one-dot chain line in FIG. 12) in the cross direction (along arrow C in FIG. 12) of the cavity along the extensional direction (along arrow B in FIG. 12) of the cavity at the prescribed distance (about 20 μm) from the centerline 500 while the wire bonding portion 115a is arranged on the upper surface of the insulating film 114 (see FIG. 13) in the region provided with no ridge portion 113a so that neither the ridge portion 113a nor the ohmic layer 116 is arranged immediately under the wire bonding portion 115a, whereby the impact load applied to the wire bonding portion 115a from above in wire bonding with the Au wire is not directly applied to the ridge portion 113a and the ohmic layer 116. Thus, the ridge portion 113a and the ohmic layer 116 can be protected against the impact load in wire bonding.

The remaining effects of the second embodiment are similar to those of the aforementioned first embodiment.

A simulation performed for confirming the effects of the aforementioned second embodiment will be now described with reference to FIGS. 11, 12, 15 and 16.

Figure 15:
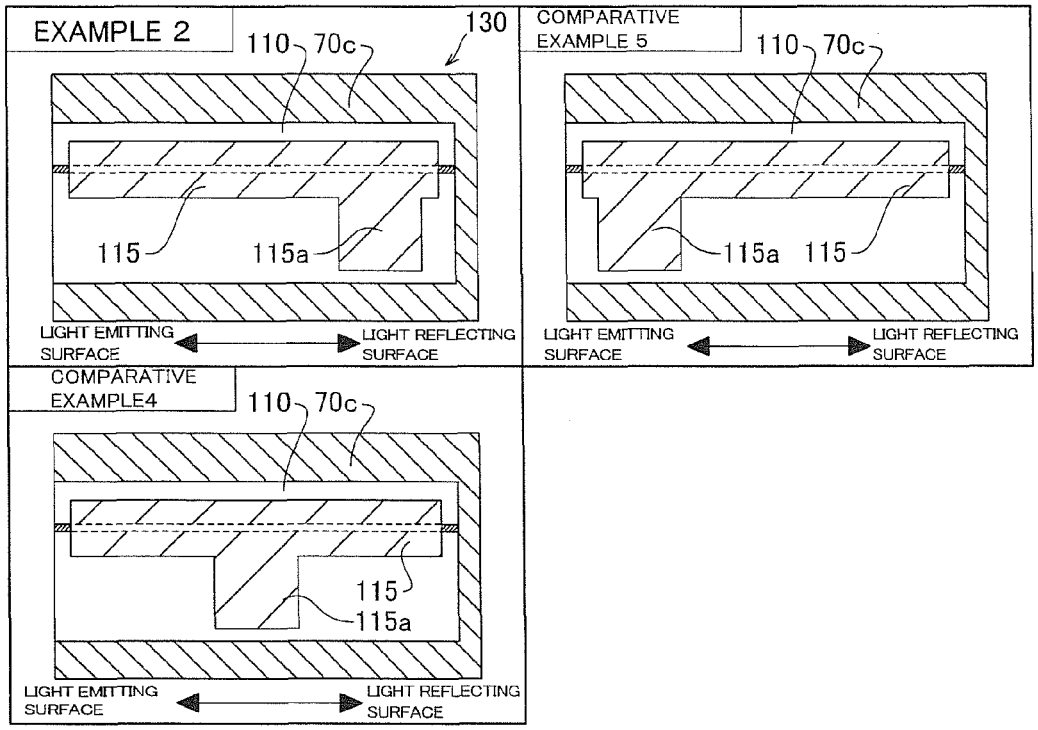
FIG. 15 is a diagram showing positions of wire bonding portions on semiconductor laser elements in simulation for confirming effects of the second embodiment shown in FIG. 12.

In this simulation, a heat dissipation model in an laser operation of a semiconductor laser element 50 (see FIGS. 11 and 12) according to Example 2 corresponding to the aforementioned second embodiment was prepared as shown in FIG. 15. Heat dissipation models in a laser operation of semiconductor laser elements 50 provided with wire bonding portions 115a on positions shown in FIG. 15 respectively were prepared as comparative examples 4 and 5. More specifically, in the heat dissipation model according to comparative example 4, the wire bonding portion 115a was provided around the substantial center in an extensional direction of a cavity. In the heat dissipation model according to the comparative example 5, the wire bonding portion 115a was provided around a position corresponding to a light emitting surface 110a in an extensional direction of a cavity. In this simulation, the temperature distribution of generated heat of the semiconductor laser element portions 110 was calculated according to the heat dissipation models considering of heat dissipation from the semiconductor laser element portions 110 (see FIG. 11) to bases 70 (see FIG. 11) and heat dissipation in air from the semiconductor laser element portion (see FIG. 11) through the p-side electrodes 115 and the wire bonding portion 115a.

Figure 16:
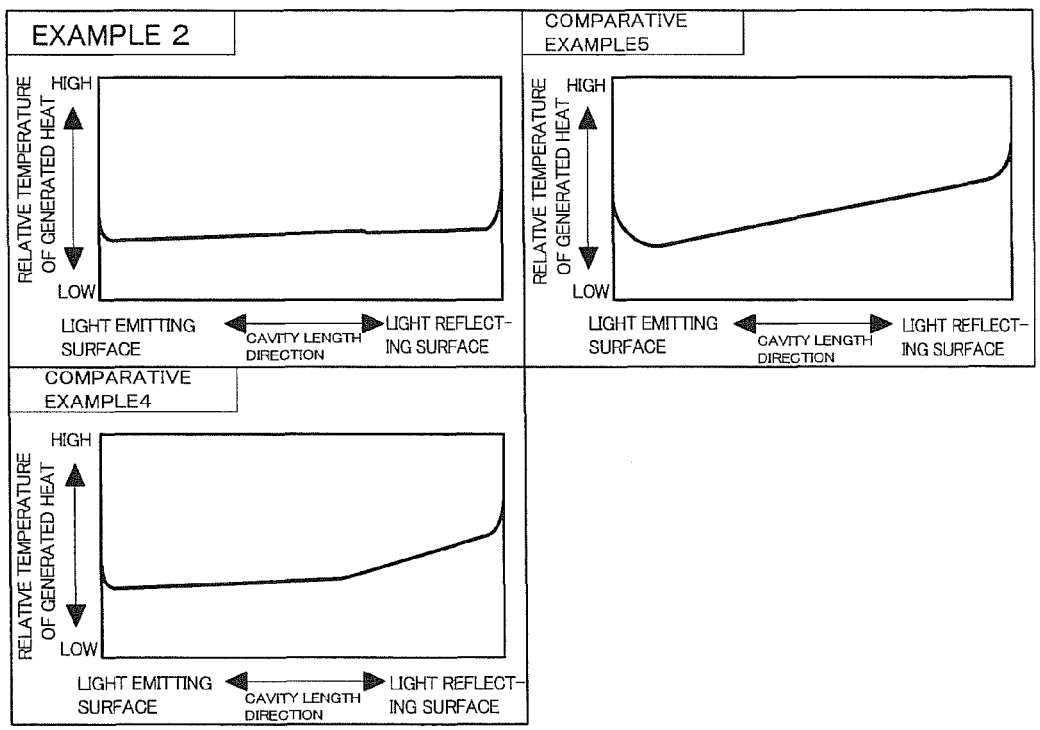
FIG. 16 is a diagram showing results of the simulation performed for confirming the effects of the second embodiment shown in FIG. 12.

The temperature distribution of generated heat of the semiconductor laser element portions in the laser operation in the semiconductor laser elements 50 according to the aforementioned Example 2 and comparative examples 4 and 5 was calculated. FIG. 16 shows these simulation results.

According to comparative examples 4 and 5, the results that temperature distribution of generated heat in the extensional direction of the cavity of the semiconductor laser element portions occurs, as shown in FIG. 16. This is conceivably because radiation performance on the region (around the light reflecting surface 110b (see FIG. 11)) where the conductive bonding layer 140 between the semiconductor laser element portion 110 and the base 70 has a large thickness is relatively deteriorated as compared with radiation performance on the region (around the light emitting surface 110a (see FIG. 11)) where the conductive bonding layer 140 has a small thickness, and hence temperature of heat generated on this region is increased. According to the prediction result, on the other hand, temperature distribution of generated heat in the extensional direction of the cavity was substantially uniform in the aforementioned Example 2. This is conceivably because the wire bonding portion 115a is provided on the region (around the light reflecting surface 110b) where the thickness of the conductive bonding layer 140 is large and the radiation performance is relatively deteriorated so that the area where the p-side electrode 115 touches air is increased as compared with other region (around the center of the cavity and the light emitting surface 110a where the thickness of the conductive bonding layer 140 is relatively small) and hence the radiation performance is improved. It has been confirmed from these results that the temperature distribution of heat generated in the semiconductor laser element 110 can be uniformized also in the aforementioned Example 2.

Third Embodiment

Figure 17:
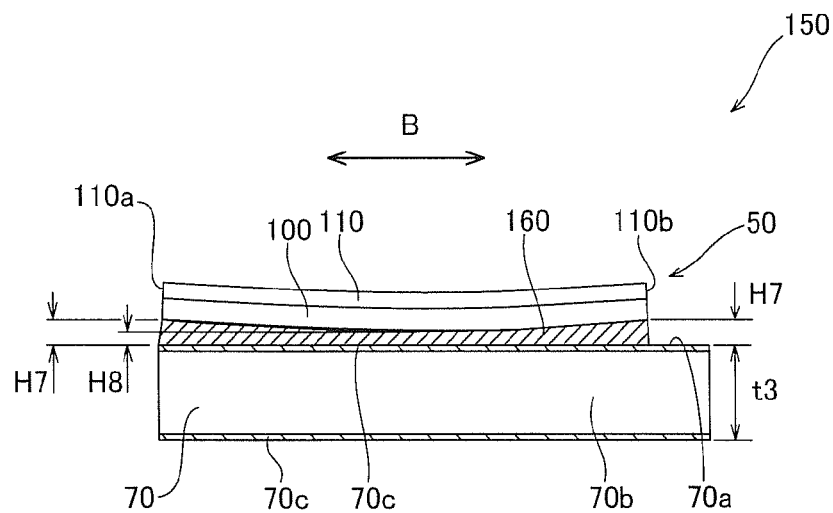
FIG. 17 is a sectional view showing the structure of a semiconductor laser device according to a third embodiment of the present invention.
Figure 18:
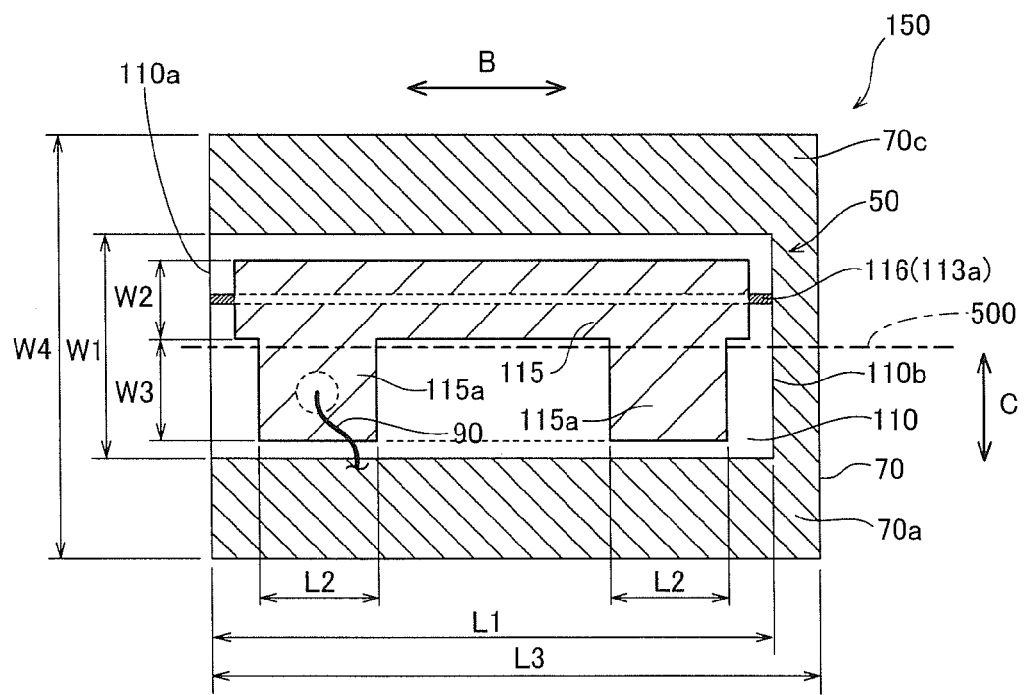
FIG. 18 is a plan view showing the structure of a semiconductor laser device according to the third embodiment shown in FIG. 17.
Figure 19:
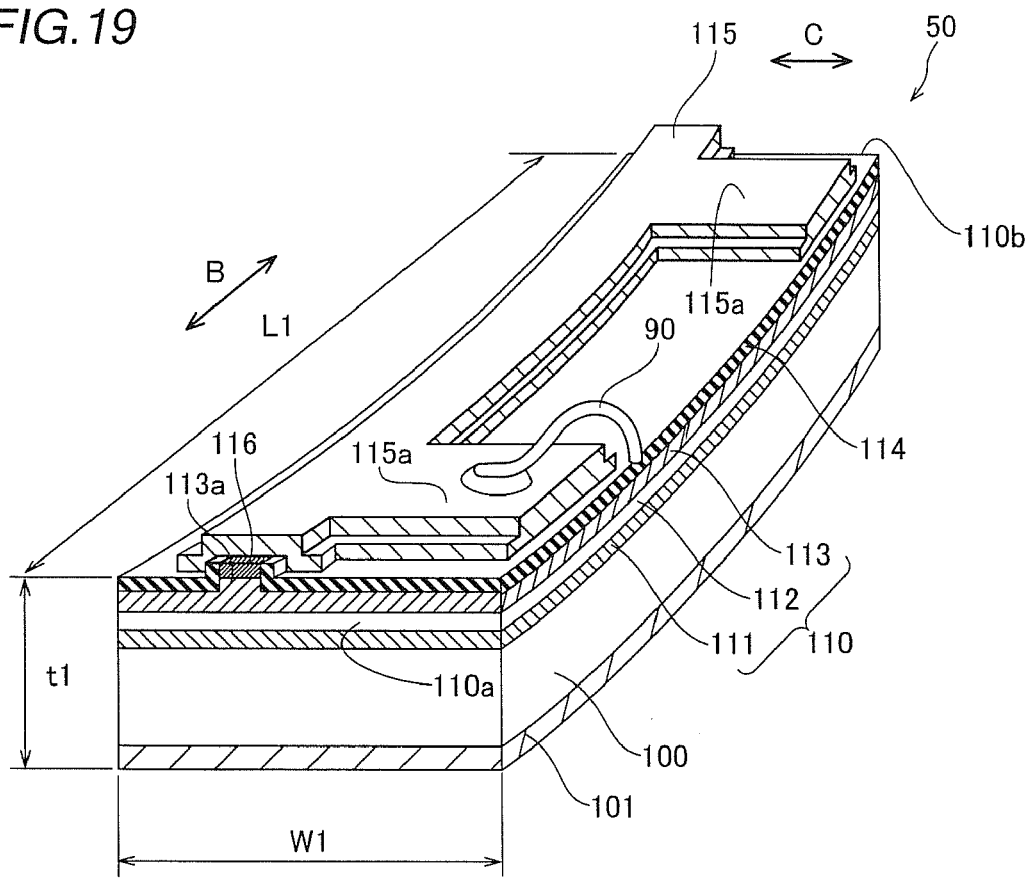
FIG. 19 is a perspective view showing the structure of the semiconductor laser device according to the third embodiment shown in FIG. 17.

Referring to FIGS. 17 to 19, a semiconductor laser element 50 is so fixed to a base 70 that the distance between the semiconductor laser element 50 and the base 70 around a light emitting surface 110a and a light reflecting surface 110b of the cavity is larger than the distance between the semiconductor laser element 50 and the base 70 around the center of a cavity in a semiconductor laser device 150 according to a third embodiment of the present invention, dissimilarly to the aforementioned first embodiment.

In the semiconductor laser device 150 according to the third embodiment, the semiconductor laser element 50 is so fixed to the base 70 through a conductive bonding layer 160 (see FIG. 17) of AuSn or the like that the distance between the convex side (provided with a substrate 100) of a warp of the semiconductor laser element 50 and the base 70 changes along the extensional direction (along arrow B) of the cavity similarly to the aforementioned first and second embodiments, as shown in FIGS. 17 and 19.

According to the third embodiment, the conductive bonding layer 160 is so formed that the distance H7 (thickness of the conductive bonding layer 160: about 3 μm) between the semiconductor laser element 50 and the base 70 around the light reflecting surface 110b and the light emitting surface 110a of the cavity is larger than the distance H8 (thickness of the conductive bonding layer 160: about 1 μm) between the semiconductor laser element 50 and the base 70 around the center of the cavity for fixing the side of the semiconductor laser element 50 provided with the substrate 100 to the base 70 through the conductive bonding layer 160, as shown in FIG. 17.

As shown in FIG. 17, the portion of the semiconductor laser element 50 around the center of the cavity is arranged substantially parallelly to the upper surface 70a of the base 70. In other words, the semiconductor laser element 50 is so arranged that the direction of a laser beam transmitted around the center of the cavity is substantially parallel to the extensional direction of the upper surface 70a of the base 70.

According to the third embodiment, wire bonding portions 115a provided on a p-side electrode 115 of the semiconductor laser element 50 are so arranged as to correspond to the portions around the light emitting surface 110a and the light reflecting surface 110b of the cavity respectively, as shown in FIGS. 18 and 19. In other words, the wire bonding portions 115a are provided on portions (two portions) of the p-side electrode 115 corresponding to the vicinity of regions (where the conductive bonding layer 160 substantially has the thickness H7 (see FIG. 17)) where the distance between the semiconductor laser element 50 and the base 70 is substantially the largest. FIGS. 18 and 19 each show an example of the semiconductor laser device in which the portion around the light emitting surface 110a along arrow B is wire-bonded with an Au wire 90.

According to the third embodiment, a ridge portion 113a and the p-side electrode 115 of the semiconductor laser element 50 are so formed on the upper surface of the semiconductor laser element portion 110 as to extend substantially parallelly to a centerline 500 (shown by a one-dot chain line) (see FIG. 18) of the cavity of the semiconductor laser element 50 in the cross direction (along arrow C) at a prescribed distance (about 20 μm) from the centerline 500, as shown in FIGS. 18 and 19. The wire bonding portions 115a protrude from the p-side electrode 115 formed immediately above the ridge portion 113a through an ohmic layer 116 in the direction C of the semiconductor laser element 50, and is arranged on the upper surface of an insulating film 114 in a region provided with no ridge portion 113b across the centerline 500 (see FIG. 18).

The remaining structure of the semiconductor laser device 150 according to the third embodiment is similar to those of the aforementioned first and second embodiments.

A manufacturing process for the semiconductor laser device 150 according to the third embodiment will be now described with reference to FIGS. 2 and 17 to 20.

First, the semiconductor laser element 50 is formed similarly to the aforementioned first and second embodiments.

According to the third embodiment, the convex side (provided with the substrate 100) of the warp of the semiconductor laser element 50 is so die-bonded to the base 70 that the distance H7 (thickness of the conductive bonding layer 160: about 3 μm) between the semiconductor laser element 50 and the base 70 around the light emitting surface 110a and the light reflecting surface 110b of the cavity of the semiconductor laser element 50 is larger than the distance H8 (thickness of the conductive bonding layer 160: about 1 μm) between the semiconductor laser element 50 and the base 70 around the center of the cavity, as shown in FIG. 17. At the same time, the base 70 is fixed to a seat portion 82 (see FIG. 2) of a stem 80.

Figure 20:
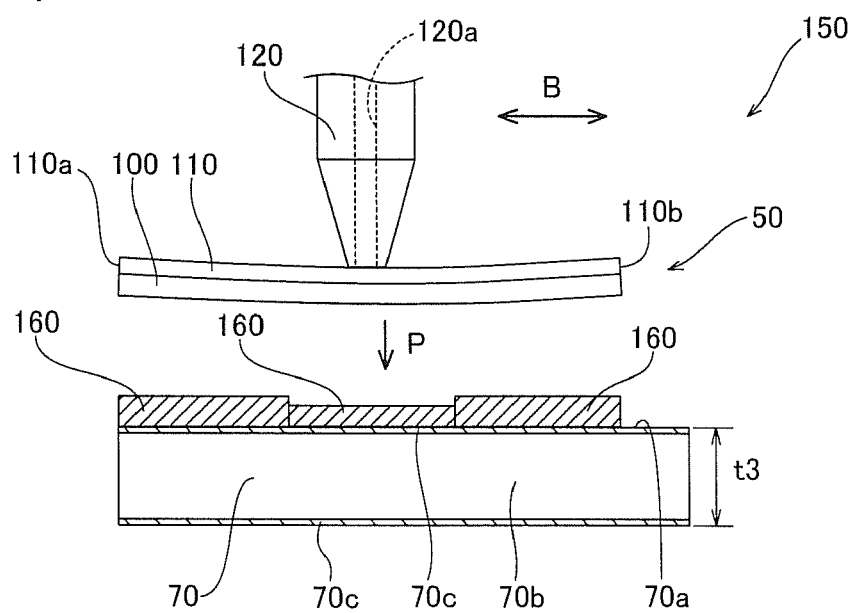
FIG. 20 is a diagram illustrating a manufacturing process for a semiconductor laser comprising the semiconductor laser device according to the third embodiment of the present invention.

According to the third embodiment, the conductive bonding layer 160 is so arranged on the upper surface 70a of the base 70 that the thickness thereof changes in two ways (two stages) in the longitudinal direction (along arrow B) of the cavity, as shown in FIG. 20. In other words, the conductive bonding layer 160 of solder is so arranged on the upper surface 70a of the base 70 that the thickness thereof increases stepwise from around the center of the cavity (thickness: about 1 μm) toward the light emitting surface 110a and the light reflecting surface 110b (thickness of cavity end: about 3 μm).

As shown in FIG. 20, the convex side (provided with the substrate 100) of the warp of the semiconductor laser element 50 is die-bonded to the base 70, similarly to the aforementioned first and second embodiments. When the portion of the semiconductor laser element 50 around the center of the cavity is pressed with a collet 120, the region (around the center of the cavity of the semiconductor laser element 50) of the conductive bonding layer 160 pressed with the collet 120 is fused to move to other regions (around the light emitting surface 110a and around the light reflecting surface 110b) not pressed with the collet 120 while the regions of the conductive bonding layer 160 between the portions of the semiconductor laser element 50 around the light emitting surface 110a and around the light reflecting surface 110b and the base 70 are also fused due to thermal conduction. Consequently, the thickness of the conductive bonding layer 160 varies from H8 to H7 (see FIG. 17) with the warp of the semiconductor laser element 50, as shown in FIG. 17. In other words, the warp of the semiconductor laser element 50 is not corrected but the thickness of the conductive bonding layer 160 varies with the warp of the semiconductor laser element 50 for fixing the semiconductor laser element 50 to the base 70 also in the third embodiment.

The remaining manufacturing process for the semiconductor laser device 150 according to the third embodiment is similar to those of the aforementioned first and second embodiments. A semiconductor laser comprising the semiconductor laser device 150 according to the third embodiment is manufactured in the aforementioned manner.

According to the third embodiment, as hereinabove described, a plurality of the wire bonding portions 115a are provided around the light emitting surface 110a and the light reflecting surface 110b of the cavity of the semiconductor laser element 50 (two portions), whereby heat generated by emitting a laser beam (heat of the ridge portion 113a generated by scattering the laser beam on the light emitting surface 110a and heat of the ridge portion 113a generated by absorbing the laser beam on the light reflecting surface 110b) can be effectively (diffused) radiated in air through the two wire bonding portions 115a provided around the region (where conductive bonding layer 160 substantially has the thickness H7 (about 3 μm) (see FIG. 17)) having the largest distance between the semiconductor laser element 50 and the base 70. Thus, it is possible to obtain radiation performance equivalent to radiation performance from the semiconductor laser element portion 110 to the base 70 on the region (where the conductive bonding layer 60 substantially has the thickness H8 (about 1 μm) (see FIG. 17)) having a smaller distance between the semiconductor laser element 50 and the base 70 around the center of the cavity and hence temperature distribution of heat generated in the semiconductor laser element 50 can be uniformized.

The remaining effects of the third embodiment are similar to those of the aforementioned first and second embodiments.

A simulation performed for confirming the effects of the aforementioned third embodiment will be now described with reference to FIGS. 17, 18, 21 and 22.

Figure 21:
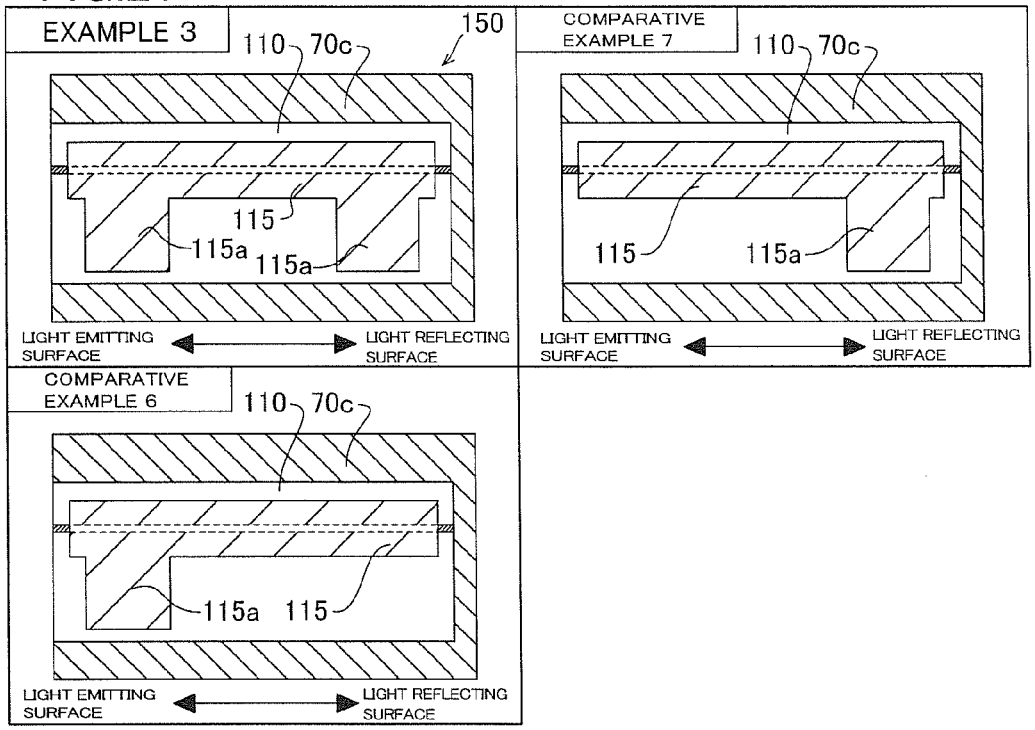
FIG. 21 is a diagram showing positions of wire bonding portions on semiconductor laser elements in simulation for confirming effects of the third embodiment shown in FIG. 18.

In this simulation, a heat dissipation model in an laser operation of a semiconductor laser element 50 (see FIGS. 17 and 18) according to Example 3 corresponding to the aforementioned third embodiment was prepared as shown in FIG. 21. Heat dissipation models in a laser operation of semiconductor laser elements 50 provided with wire bonding portions 115a on positions shown in FIG. 21 respectively were prepared as comparative examples 6 and 7. More specifically, in the heat dissipation model according to comparative example 6, the wire bonding portion 115a was provided around a position corresponding to the light emitting surface 110a in an extensional direction of a cavity. In the heat dissipation model according to comparative example 7, the wire bonding portion 115a was provided around a position corresponding to the light reflecting surface 110b in an extensional direction of a cavity. In this simulation, the temperature distribution of heat generated the semiconductor laser element portions 110 was calculated according to the heat dissipation models considering heat dissipation from the semiconductor laser element portions 110 (see FIG. 17) to bases 70 (see FIG. 17) and heat dissipation in air from the semiconductor laser element portion (see FIG. 17) through the p-side electrodes 115 and the wire bonding portion 115a.

Figure 22:
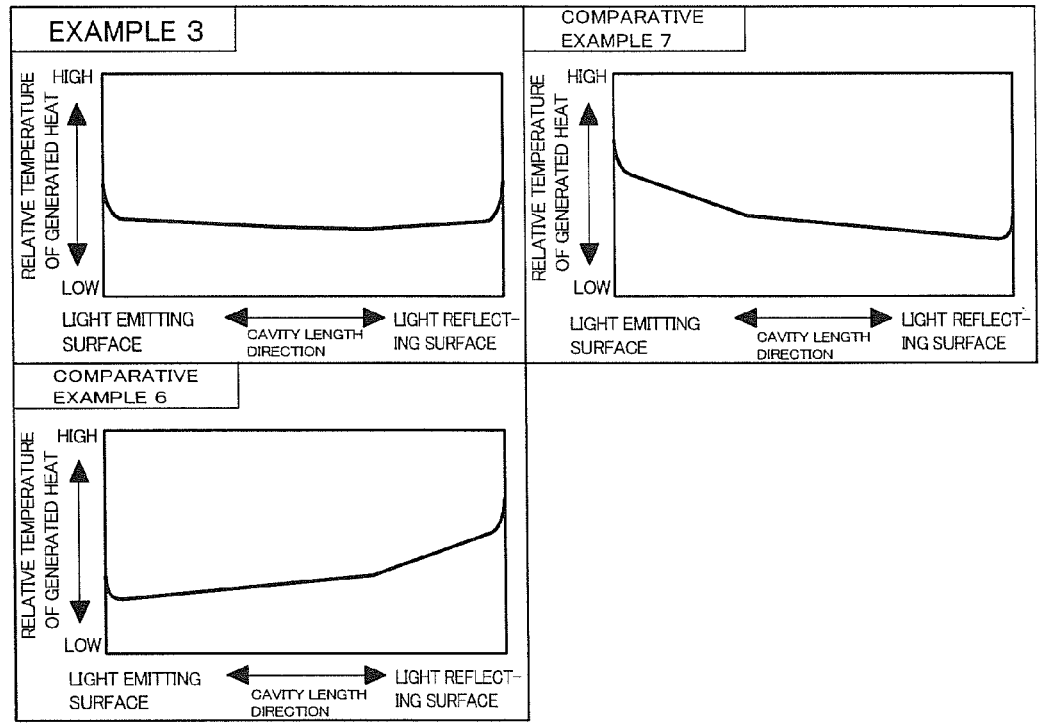
FIG. 22 is a diagram showing results of the simulation performed for confirming the effects of the third embodiment shown in FIG. 18.

The temperature distribution of generated heat of the semiconductor laser element portions in the laser operation in the semiconductor laser elements 50 according to the aforementioned Example 3, and comparative examples 6 and 7 was calculated. FIG. 22 shows these simulation results.

According to comparative examples 6 and 7, the results that temperature distribution of generated heat in the extensional direction of the cavity of the semiconductor laser element portions occurs, as shown in FIG. 22. This is conceivably because radiation performance on the region (around the light emitting surface 110a and around the light reflecting surface 110b (see FIG. 17)) where the conductive bonding layer 160 between the semiconductor laser element portion 110 and the base 70 has a large thickness is relatively deteriorated as compared with radiation performance on the region (around the center of the cavity (see FIG. 17)) where the conductive bonding layer 140 has a small thickness, and hence temperature of heat generated on these regions is increased. According to the prediction result, on the other hand, temperature distribution of generated heat in the extensional direction of the cavity was substantially uniform in the aforementioned Example 3. This is conceivably because the wire bonding portion 115a is provided on the regions (around the light emitting surface 110a and around the light reflecting surface 110b) where the thickness of the conductive bonding layer 160 is large and the radiation performance is relatively deteriorated so that the area where the p-side electrode 115 touches air is increased as compared with other region (around the center of the cavity where the thickness of the conductive bonding layer 140 is relatively small) and hence the radiation performance is improved. It has been confirmed from these results that the temperature distribution of heat generated in the semiconductor laser element 110 can be uniformized also in the aforementioned Example 3.

Fourth Embodiment

Figure 23:
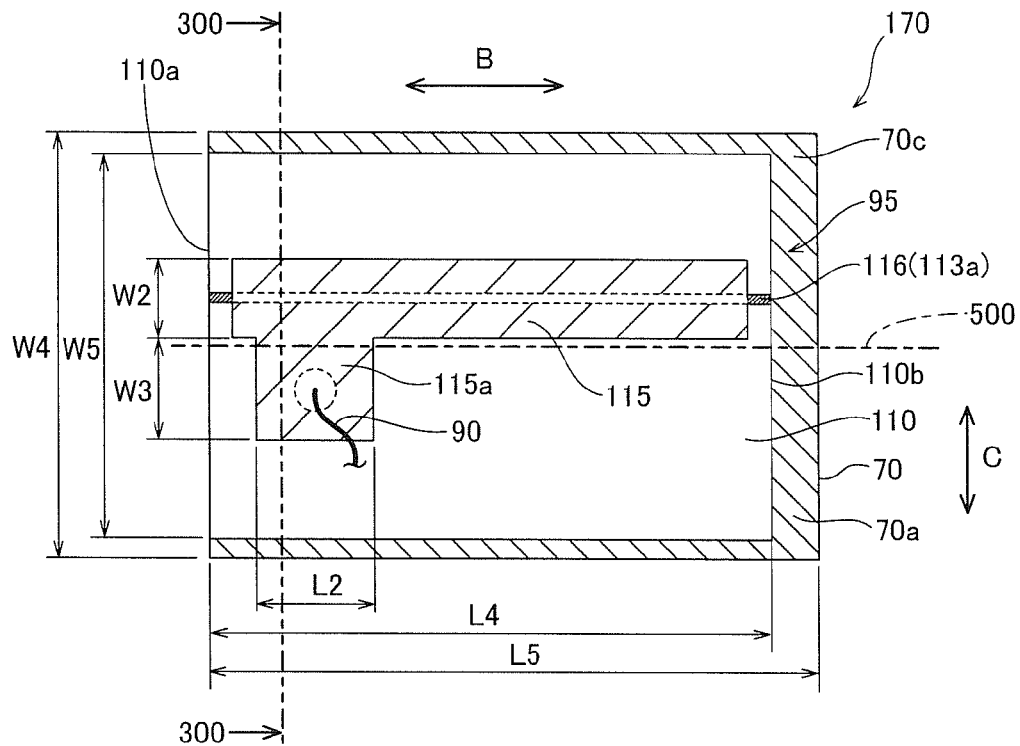
FIG. 23 is a plan view showing the structure of a semiconductor laser device according to a fourth embodiment of the present invention.
Figure 24:
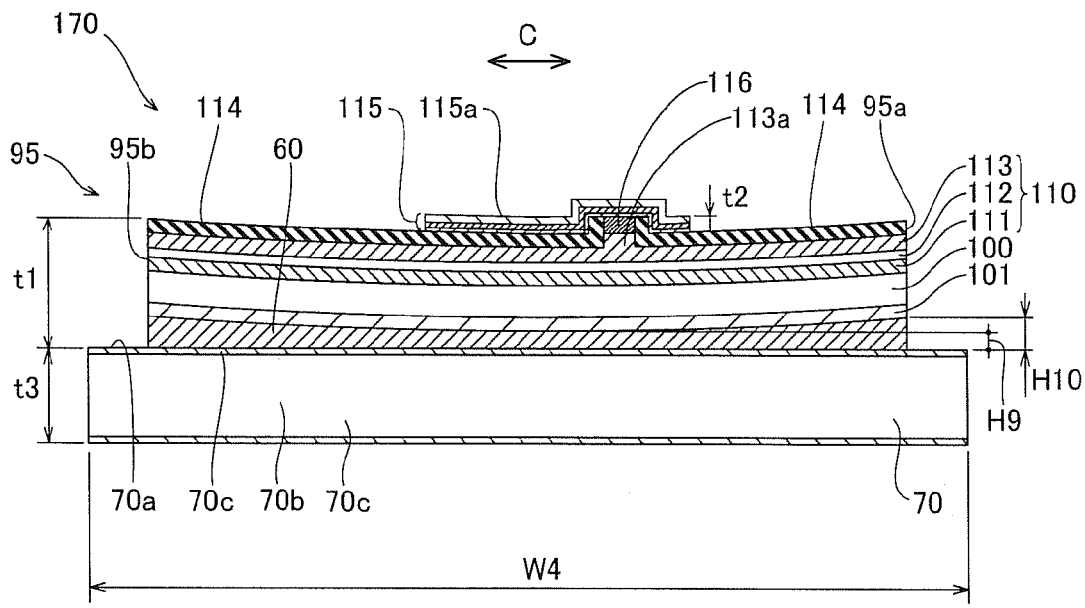
FIG. 24 is a sectional view showing the structure of the semiconductor laser device according to the fourth embodiment shown in FIG. 23.

Referring to FIGS. 3, 23 and 24, a semiconductor laser element 95 warped not only in the extensional direction (along arrow B) of a cavity but also in the cross direction thereof (along arrow C: perpendicular to the extensional direction of the cavity) is fixed to a base 70 in a semiconductor laser device 170 according to a fourth embodiment of the present invention, dissimilarly to the aforementioned first embodiment. The direction C is an example of the "second direction" in the present invention. FIG. 24 is a sectional view of the semiconductor laser device 170 taken along the line 300-300 in FIG. 23.

In a semiconductor laser comprising the semiconductor laser device 170 according to the fourth embodiment, the semiconductor laser element 95 is fixed to the base 70 through a conductive bonding layer 60 (see FIG. 24) of AuSn or the like, as shown in FIGS. 23 and 24. The semiconductor laser element 95 has a width (W5) of about 800 μm, a length (L4) of about 900 μm and a thickness (t1) of about 100 μm. The base 70 has a width (W4) of about 900 μm, a length (L5) of about 1000 μm and a thickness (t3) of about 250 μm. The sectional shape of the semiconductor laser element 95 along the extensional direction (along arrow B) of the cavity is similar to the sectional shape of the semiconductor laser element 50 shown in FIG. 3.

According to the fourth embodiment, the semiconductor laser element 95 has the warp (about 0.5 μm to about 3 μm) also along the cross direction (along arrow C) of the cavity in addition to the extensional direction (along arrow B) of the cavity, as shown in FIG. 24. Therefore, the semiconductor laser element 95 is so warped that an upper surface (first main surface) is concaved and a lower surface (second main surface) is convexed, and hence the surface of a semiconductor laser element portion 110 opposite to a substrate 100 is concaved also in the cross direction (along arrow C) of the cavity. Thus, the convex side (provided with the substrate 100) of the warp of the semiconductor laser element 95 along arrows B and C is fixed to the base 70.

The distance (thickness of the conductive bonding layer 60) H9 between the semiconductor laser element 95 and the base 70 around the center of the semiconductor laser element 95 in the direction (along arrow C) along a cavity facet (a light emitting surface 110a or a light reflecting surface 110b) is smaller than the distance H10 (thickness of the conductive bonding layer 60) between the semiconductor laser element 95 and the base 70 around ends 95a and 95b of the semiconductor laser element 95 in the direction (along arrow C) along the cavity facet, as shown in FIG. 24.

According to the fourth embodiment, a wire bonding portion 115a provided on a p-side electrode 115 of the semiconductor laser element 95 is arranged on the upper surface of an insulating film 114 around the light emitting surface 110a, as shown in FIG. 23. In other words, the wire bonding portion 115a is provided on a portion of the p-side electrode 115 corresponding to the vicinity of a region (where the conductive bonding layer 60 substantially has a thickness H3 (see FIG. 3)) where the distance between the semiconductor laser element 95 and the base 70 is substantially the largest.

The wire bonding portion 115a is provided on a portion of the p-side electrode 115 corresponding to the vicinity of a region (where the conductive bonding layer 60 substantially has a thickness H9) where the distance between the semiconductor laser element 95 and the base 70 along arrows C is substantially the smallest, as shown in FIG. 24. In other words, the wire bonding portion 115a is provided around the portion of the p-side electrode 115 corresponding to the vicinity of the substantial center of the semiconductor laser element 95 along arrow C.

According to the fourth embodiment, a ridge portion 113a and the p-side electrode 115 of the semiconductor laser element 95 are so formed as to extend substantially parallelly to a centerline 500 (shown by a one-dot chain line) of the semiconductor laser element 95 in the cross direction (along arrow C) of the cavity at a prescribed distance (about 20 μm) from the centerline 500, as shown in FIG. 23. The wire bonding portion 115a protrudes from the p-side electrode 115 formed immediately above the ridge portion 113a through an ohmic layer 116 in the cross direction (along arrow C) of the semiconductor laser element 95, and is arranged on the upper surface of the insulating film 114 in the region provided with no ridge portion 113b across the centerline 500.

The remaining structure of the semiconductor laser device 170 according to the fourth embodiment and a manufacturing process for a semiconductor laser comprising the semiconductor laser device 170 are similar to those of the aforementioned first embodiment.

According to the fourth embodiment, as hereinabove described, the semiconductor laser element 95 is so fixed to the base 70 that the distance between the convex side of the warp of the semiconductor laser element 95 and the base 70 varies with the warp of the semiconductor laser element 95 along the extensional direction (along arrow B) of the cavity and the cross direction (along arrow C) of the cavity, whereby the semiconductor laser element 95 can be fixed to the base 70 with no correction of the warp of the semiconductor laser element 95 itself even if the warp of the semiconductor laser element 95 is dispersed not only in the direction B but also in the direction C. Thus, the semiconductor laser element 95 can be prevented from excess stress resulting from correction of the warp. Therefore, deterioration of laser characteristics and breakage of the semiconductor laser element 95 (semiconductor laser element portion 110) can be suppressed.

According to the fourth embodiment, the wire bonding portion 115a is provided around the portion of the p-side electrode 115 corresponding to the substantially central portion (region around a centerline 500) of the semiconductor laser element 95 in the cross direction along arrow C, whereby the wire bonding portion 115a provided on the region of the semiconductor laser element 95 minimally inclined along arrow C with respect to the upper surface 70a of the base 70 can be wire-bonded with the Au wire 90, and hence the semiconductor laser element 95 is prevented from application of excess stress in wire bonding dissimilarly to a case of wire-bonding a portion of the p-side electrode 115 corresponding to a largely inclined portion of the semiconductor laser element 50. Thus, deterioration of laser characteristics and breakage of the semiconductor laser element 95 (semiconductor laser element portion 110) can be further suppressed, in addition to the effects of homogenization of temperature distribution of heat generated in the semiconductor laser element 95 according to the aforementioned first embodiment.

According to the fourth embodiment, the wire bonding portion 115a is provided around the portion of the p-side electrode 115 corresponding to the vicinity of the substantially central portion of the semiconductor laser element 95 along arrow C, whereby an error in mounting dimension along arrow C in wire-bonding with an Au wire can be allowed as compared with a case where the wire bonding portion 115a is provided on a portion of the p-side electrode 115 corresponding to the ends 95a and 95b of the semiconductor laser element 95. Thus, the assembly yield of the semiconductor laser device 40 can be improved.

According to the fourth embodiment, the ridge portion 113a and the wire bonding portion 115a are formed in the directions opposite to each other through the substantially central portion (around the centerline 500) of the semiconductor laser element 95 in the cross direction (along arrow C) of the cavity, whereby the wire bonding portion 115a can be further approached to the centerline 500 than the ridge portion 113a deviating from the centerline 500 toward one side along arrow C. Thus, the wire bonding portion 115a provided on the region of the semiconductor laser element 95 minimally inclined with respect to the upper surface 70a of the base 70 in the direction C can be wire-bonded. Further, an impact load applied to the wire bonding portion 115a from above in wire bonding can be inhibited from biased application in the cross direction (along arrow C) of the cavity of the semiconductor laser element 95. The remaining effects of the fourth embodiment are similar to those of the aforementioned first embodiment.

Fifth Embodiment

Figure 25:
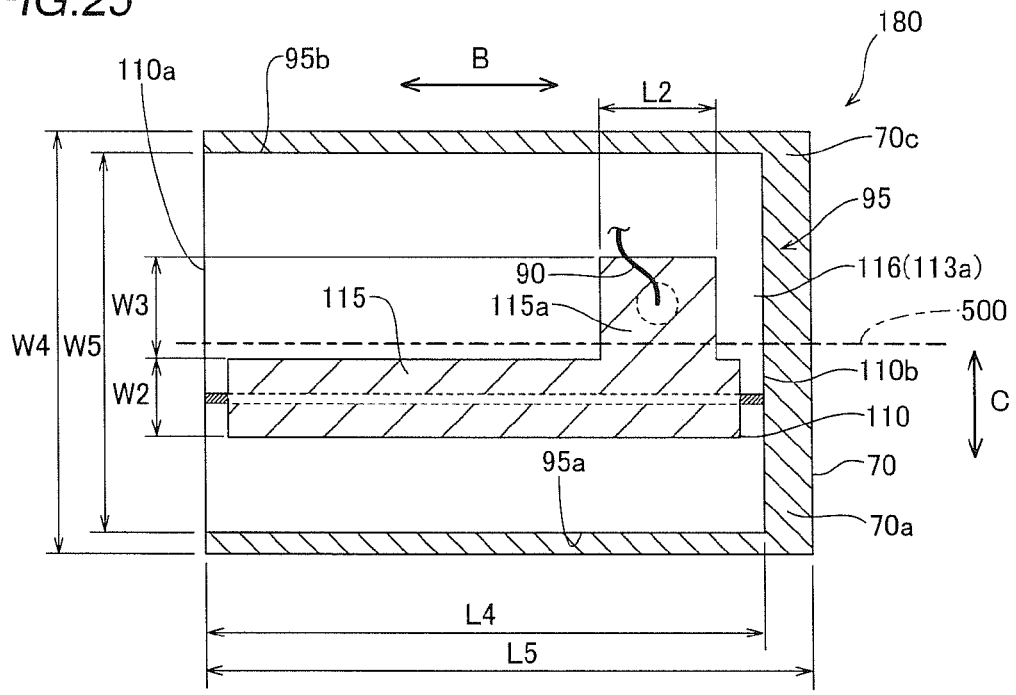
FIG. 25 is a plan view showing the structure of a semiconductor laser device according to a fifth embodiment of the present invention.

Referring to FIGS. 11, 24 and 25, a semiconductor laser element 95 is so fixed to a base 70 that the distance between the semiconductor laser element 95 and the base 70 around a light reflecting surface 110b of a cavity is larger than the distance between the semiconductor laser element 95 and the base 70 around a light emitting surface 110a of the cavity in a semiconductor laser device 180 according to a fifth embodiment of the present invention, dissimilarly to the aforementioned fourth embodiment.

In the semiconductor laser device 180 according to the fifth embodiment, the semiconductor laser element 95 is fixed to the base 70 through a conductive bonding layer 60 so formed that the distance (corresponding to the distance H5 shown in FIG. 11) between the semiconductor laser element 95 and the base 70 around the light reflecting surface 110b of the cavity is larger than the distance (corresponding to the distance H6 shown in FIG. 11) between the semiconductor laser element 95 and the base 70 around the light emitting surface 110a of the cavity, similarly to the sectional shape of the semiconductor laser element 50 along arrow B shown in FIG. 11.

The distance (corresponding to the distance H9 shown in FIG. 24) between the semiconductor laser element 95 and the base 70 around the center of the semiconductor laser element 95 in the direction (along arrow C) along a cavity facet (the light emitting surface 110a or the light reflecting surface 110b) is smaller than the distance (corresponding to the distance H10 shown in FIG. 24) between the semiconductor laser element 95 and the base 70 around ends 95a and 95b of the semiconductor laser element 95 in the direction (along arrow C) along the cavity facet, similarly to the sectional shape of the semiconductor laser element 95 along arrow C shown in FIG. 24.

According to the fifth embodiment, a wire bonding portion 115a provided on a p-side electrode 115 of the semiconductor laser element 95 is arranged on the upper surface of an insulating film 114 around the light reflecting surface 110b, as shown in FIG. 25. In other words, the wire bonding portion 115a is provided on a portion of the p-side electrode 115 corresponding to the vicinity of a region (where the conductive bonding layer 60 substantially has the thickness H5 (see FIG. 11)) where the distance between the semiconductor laser element 95 and the base 70 is substantially the largest.

The wire bonding portion 115a is provided on a portion of the p-side electrode 115 corresponding to the vicinity of a region (where the conductive bonding layer 60 substantially has the thickness H9) where the distance between the semiconductor laser element 95 and the base 70 along arrow C is substantially the smallest, similarly to the sectional shape of the semiconductor laser element 95 along arrow C in FIG. 24. In other words, the wire bonding portion 115a is provided around the portion of the p-side electrode 115 corresponding to the vicinity of the substantial center of the semiconductor laser element 95 along arrow C.

The remaining structure of the semiconductor laser device 180 according to the fifth embodiment and a manufacturing process for a semiconductor laser comprising the semiconductor laser device 180 are similar to those of the aforementioned fourth embodiment.

According to the fifth embodiment, as hereinabove described, the wire bonding portion 115a is provided around the portion of the p-side electrode 115 corresponding to the substantially central portion (region around a centerline 500) of the semiconductor laser element 95 along arrow C, whereby the wire bonding portion 115a provided on the region of the semiconductor laser element 95 minimally inclined along arrow C with respect to the upper surface 70a of the base 70 can be wire-bonded with the Au wire 90, and hence the semiconductor laser element 95 is prevented from application of excess stress in wire bonding dissimilarly to a case of wire-bonding a portion of the p-side electrode 115 corresponding to a largely inclined portion of the semiconductor laser element 50. Thus, deterioration of laser characteristics and breakage of the semiconductor laser element 95 (semiconductor laser element portion 110) can be further suppressed in addition to the effects of homogenization of temperature distribution of heat generated in the semiconductor laser element 95 according to the aforementioned second embodiment. The remaining effects of the fifth embodiment are similar to those of the aforementioned second and fourth embodiments.

Sixth Embodiment

Figure 26:
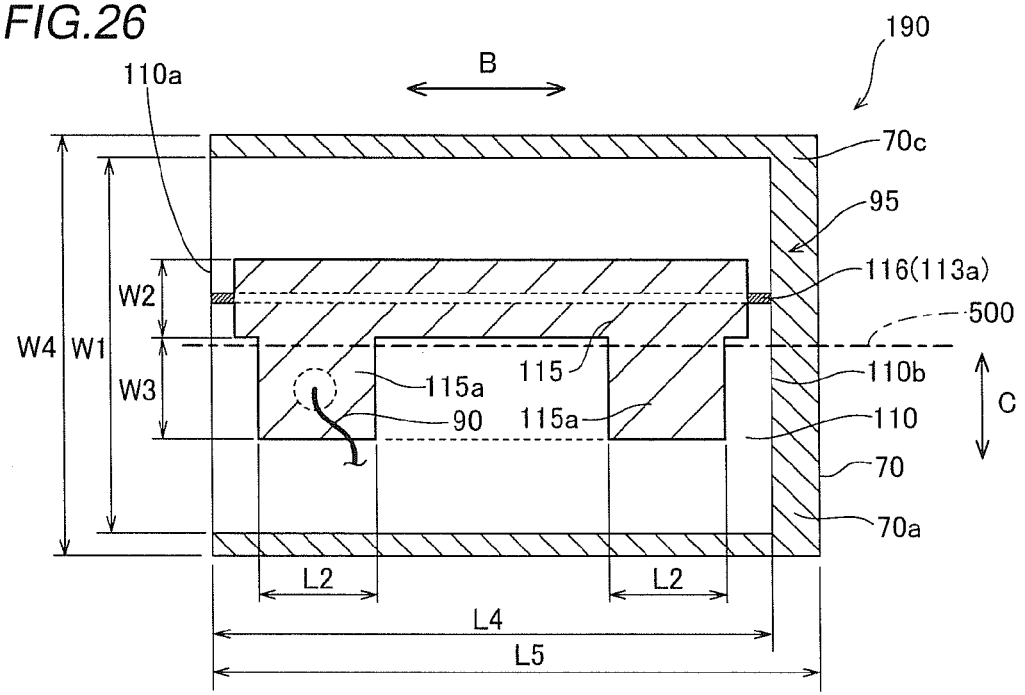
FIG. 26 is a plan view showing the structure of a semiconductor laser device according to a sixth embodiment of the present invention.

Referring to FIGS. 17, 24 and 26, a semiconductor laser element 95 is so fixed to a base 70 that the distance between the semiconductor laser element 95 and the base 70 around the center of a cavity is smaller than the distance between the semiconductor laser element 95 and the base 70 around a light reflecting surface 110b and around a light emitting surface 110a of the cavity in a semiconductor laser device 190 according to a sixth embodiment of the present invention, dissimilarly to the aforementioned fourth embodiment.

In the semiconductor laser device 190 according to the sixth embodiment, the semiconductor laser element 95 is fixed to the base 70 through a conductive bonding layer 60 so formed that the distance (corresponding to the distance H7 shown in FIG. 17) between the semiconductor laser element 95 and the base 70 around the center of the cavity is smaller than the distance (corresponding to the distance H8 shown in FIG. 17) between the semiconductor laser element 95 and the base 70 around the light reflecting surface 110b and around the light emitting surface 110a of the cavity, similarly to the sectional shape of the semiconductor laser element 50 along arrow B shown in FIG. 17.

The distance (corresponding to the distance H9 in FIG. 18) between the semiconductor laser element 95 and the base 70 in the direction (along arrow C) along a cavity facet (the light emitting surface 110a or the light reflecting surface 110b) is smaller than the distance (corresponding to the distance H10 shown in FIG. 24) between the semiconductor laser element 95 and the base 70 around an end 95a of the semiconductor laser element 95 in the direction (along arrow C) along the cavity facet, similarly to the sectional shape of the semiconductor laser element 95 along arrow C shown in FIG. 24.

According to the sixth embodiment, wire bonding portions 115a provided on a p-side electrode 115 of the semiconductor laser element 95 are so arranged as to correspond to the vicinity of the light emitting surface 110a and the light reflecting surface 110b of the cavity, as shown in FIG. 26. In other words, the wire bonding portions 115a are provided on portions (two portions) of the p-side electrode 115 corresponding to the vicinity of regions (where the conductive bonding layer 60 substantially has the thickness H7 (see FIG. 17)) where the distance between the semiconductor laser element 95 and the base 70 is substantially the largest. FIG. 26 shows an example of the semiconductor laser device in which the portion around the light emitting surface 110a along arrow B is wire-bonded with an Au wire 90.

The wire bonding portions 115a on the two portion are provided on portions of the p-side electrode 115 corresponding to the vicinity of regions (where the conductive bonding layer 60 substantially has the thickness H9) where the distance between the semiconductor laser element 95 and the base 70 along arrow C is substantially the smallest, similarly to the sectional shape shown in FIG. 24. In other words, the wire bonding portions 115a on the two portions are provided around the portions of the p-side electrode 115 corresponding to the vicinity of the substantial center of the semiconductor laser element 95 along arrow C.

The remaining structure of the semiconductor laser device 190 according to the sixth embodiment and a manufacturing process for a semiconductor laser comprising the semiconductor laser device 190 are similar to those of the aforementioned fourth embodiment.

According to the sixth embodiment, as hereinabove described, the wire bonding portions 115a are provided around the portions of the p-side electrode 115 corresponding to the substantially central portion (region around a centerline 500) of the semiconductor laser element 95 along arrow C, whereby the wire bonding portions 115a provided on the regions of the semiconductor laser element 95 minimally inclined along arrow C with respect to the upper surface 70a of the base 70 can be wire-bonded, and hence the semiconductor laser element 95 is prevented from application of excess stress in wire bonding dissimilarly to a case of wire-bonding a portion of the p-side electrode 115 corresponding to a largely inclined along arrow C portion of the semiconductor laser element 50 with an Au wire 90. Thus, deterioration of laser characteristics and breakage of the semiconductor laser element 95 (semiconductor laser element portion 110) can be further suppressed in addition to the effects of homogenization of temperature distribution of heat generated in the semiconductor laser element 95 according to the aforementioned third embodiment. The remaining effects of the sixth embodiment are similar to those of the aforementioned third and fourth embodiments.

Although the present invention has been described and illustrated in detail, it is clearly understood that the same is by way of illustration and example only and is not to be taken by way of limitation, the spirit and scope of the present invention being limited only by the terms of the appended claims.

For example, while the semiconductor laser element portion is constituted of the nitride-based semiconductor layers in each of the aforementioned embodiments, the present invention is not restricted to this but the semiconductor laser element portion may alternatively be constituted of semiconductor layers other than the nitride-based semiconductor layer.

While the fusible layer for fixing the semiconductor laser element to the base is formed by the conductive bonding layer of solder in each of the aforementioned embodiments, the present invention is not restricted to this but the fusible layer for fixing the semiconductor laser element to the base may alternatively be formed by a conductive bonding layer of a material other than solder.

While the light reflecting surface of the semiconductor laser element is arranged substantially parallelly to the upper surface of the base in each of the aforementioned first and fourth embodiments, the present invention is not restricted to this but the light reflecting surface of the semiconductor laser element may not be arranged substantially parallelly to the upper surface of the base.

While the light emitting surface of the semiconductor laser element is arranged substantially parallelly to the upper surface of the base in each of the aforementioned second and fifth embodiments, the present invention is not restricted to this but the light emitting surface of the semiconductor laser element may not be arranged substantially parallelly to the upper surface of the base.

While the portion of the semiconductor laser element around the center of the cavity is arranged substantially parallelly to the upper surface of the base in each of the aforementioned third and sixth embodiments, the present invention is not restricted to this but the portion of the semiconductor laser element around the center of the cavity may not be arranged substantially parallelly to the upper surface of the base.

While the semiconductor laser element is pressed against the base with the collet when fixed to the base in each of the aforementioned embodiments, the present invention is not restricted to this but the semiconductor laser element may alternatively be pressed against the base with a member other than the collet when fixed to the base.

While the conductive bonding layer is arranged on the upper surface of the base so that the thickness of the conductive bonding layer changes in three or two ways (three or two stages) in the longitudinal direction of the cavity in the manufacturing process for the semiconductor laser comprising the semiconductor laser device in each of the aforementioned embodiments, the present invention is not restricted to this but the conductive bonding layer may alternatively be arranged on the upper surface of the base so that the thickness thereof changes in a number of ways (stages) other than three or two ways (three or two stages) in the longitudinal direction of the cavity.

While the p-side electrode 115 and the wire bonding portion(s) 115a have the same thickness (about 5.2 µm) in each of the aforementioned embodiments, the present invention is not restricted to this but the wire bonding portion(s) 115a may be formed so as to have the thickness different from that of the p-side electrode 115. According to this structure of the modification, the contact area between the wire bonding portion 115a and air is optimize, whereby radiation performance (thermal conductivity) from the wire bonding portion 115a toward air can be further improved. Thus, temperature distribution of heat generated in the semiconductor laser element can be further uniformized.

While the wire bonding portion(s) 115a is provided around the portion(s) of the p-side electrode 115 corresponding to the ridge portion 113a provided around the substantially central portion of the semiconductor laser element in the cross direction (along arrow C) in each of the aforementioned embodiments, the present invention is not restricted to this but the wire bonding portion(s) may alternatively be provided around a portion of the p-side electrode corresponding to the vicinity of an end of the semiconductor laser element along arrow C formed with the ridge portion if the ridge portion 113a of the semiconductor laser element warped in the cross direction (along arrow C) thereof is fixed to the base so that the distance between the end of the semiconductor laser element along arrow C and the base is substantially the largest.

While the wire bonding portion(s) 115a is provided on the position(s) corresponding to the vicinity of the region where distance along arrow B between the semiconductor laser element and the base 70 is substantially the largest in each of the aforementioned embodiments, the present invention is not restricted to this but the wire bonding portion(s) 115a may alternatively be provided in the vicinity (in a prescribed range) of a position(s) of the p-side electrode 115 corresponding to the vicinity of the region where the distance between the semiconductor laser element and the base 70 is substantially the largest.

Figure 27:
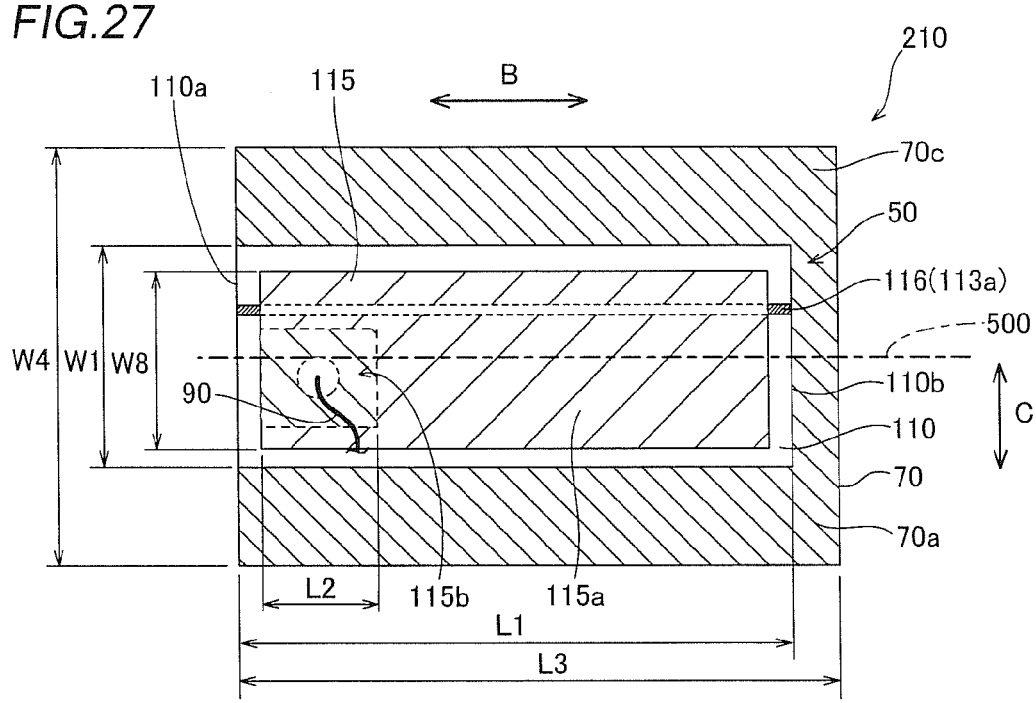
FIG. 27 is a plan view for illustrating a modification of the semiconductor laser device according to the first embodiment of the present invention.
Figure 28:
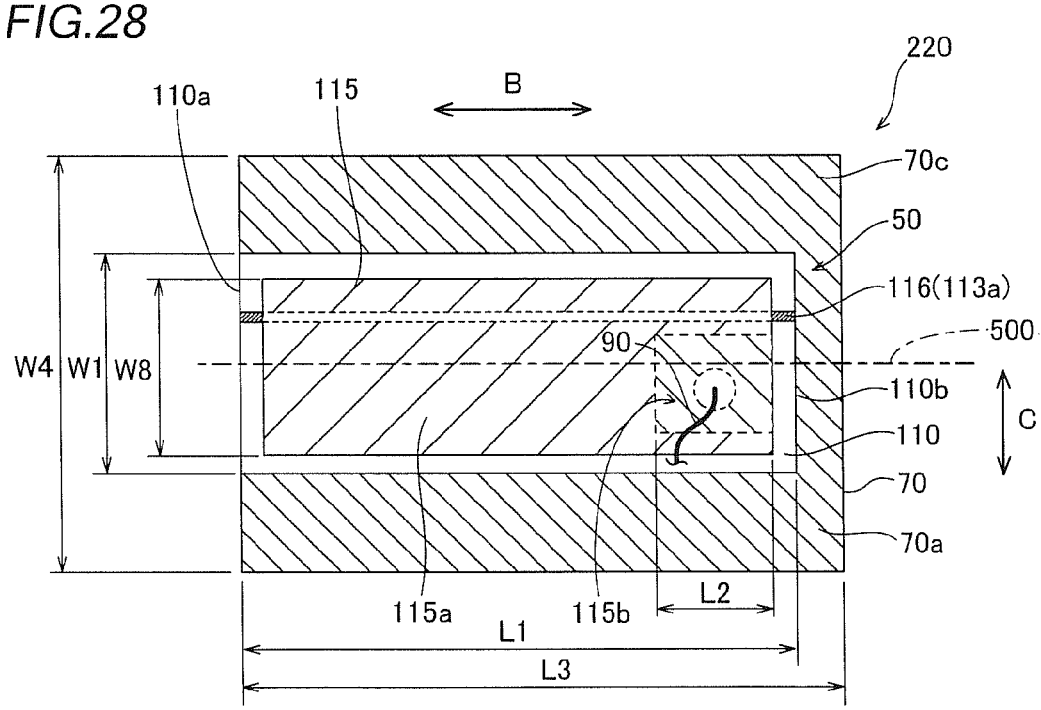
FIG. 28 is a plan view for illustrating a modification of the semiconductor laser device according to the second embodiment of the present invention.
Figure 29:
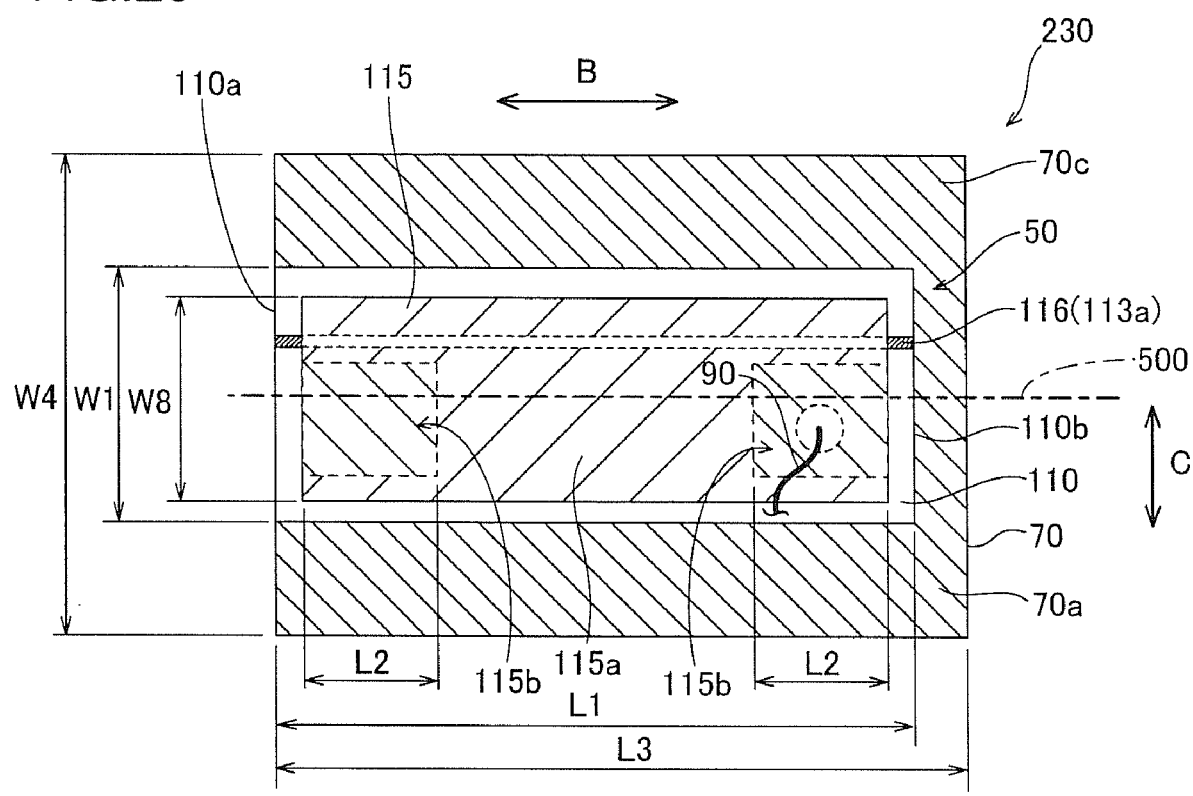
FIG. 29 is a plan view for illustrating a modification of the semiconductor laser device according to the third embodiment of the present invention.

While the wire bonding portion 115a of the p-side electrode 115 of the semiconductor laser element is provided on the position of the p-side electrode 115 corresponding to the vicinity of the region where the distance between the semiconductor laser element and the base 70 is substantially the largest to protrude from the p-side electrode 115 in the cross direction (along arrow C) of the semiconductor laser element in the aforementioned first embodiment, the present invention is not restricted to this but a wire bonding portion 115a of a semiconductor laser device 210 may alternatively be so formed as to extend along all region in the extensional direction (along arrow B) of a p-side electrode 115 of a semiconductor laser element 50, as in a modification of the first embodiment shown in FIG. 27. The p-side electrode 115 including the wire bonding portion 115a has a width W8 of about 110 µm in the direction C in FIG. 27. A wire bonding portion 115b (surrounded by broken lines) for actually wire-bonding with an Au wire may be provided around a portion corresponding to the vicinity of a region around a light emitting surface 110a of a semiconductor laser element 50, where the distance between a semiconductor laser element 50 in a wire bonding portion 115a and a base 70 is substantially the largest. According to this structure of the modification, the surface area of the p-side electrode 115 including the wire bonding portion 115a can be increased along arrow B in addition to the effects of the aforementioned first embodiment, whereby heat radiability of the semiconductor laser element can be improved through the p-side electrode 115.

While the wire bonding portion 115b is provided on the region around the wire bonding portion 115a of the portion corresponding to the vicinity of the region around the light emitting surface 110a of the semiconductor laser element 50, where the distance between the semiconductor laser element 50 of the p-side electrode 115 of the semiconductor laser element and the base 70 is substantially the largest in the aforementioned modification of the first embodiment, the present invention is not restricted to this but the wire bonding portion 115b (surrounded by broken lines) of a semiconductor laser device 220 may be provided on a region around a wire bonding portion 115a of a portion corresponding to the vicinity of a region around a light reflecting surface 110b of the semiconductor laser element 50, where the distance between the semiconductor laser element 50 and the base 70 is substantially the largest. According to this structure of the modification, the surface area of the p-side electrode 115 including the wire bonding portion 115a can be increased along arrow B in addition to the effects of the aforementioned second embodiment, whereby heat radiability of the semiconductor laser element can be improved.

While the wire bonding portion 115b is provided on the region around the wire bonding portion 115a of the portion corresponding to the vicinity of the region around the light reflecting surface 110b of the semiconductor laser element 50, where the distance between the semiconductor laser element 50 and the base 70 is substantially the largest in the aforementioned modification of the second embodiment, the present invention is not restricted to this but wire bonding portions 115b (surrounded by broken lines) of a semiconductor laser device 230 may be provided on regions around a wire bonding portion 115a of portions corresponding to the vicinity of regions around a light emitting surface 110a and a light reflecting surface 110b of the semiconductor laser element 50, where the distance between the semiconductor laser element 50 and the base 70 is substantially the largest. According to this structure of the modification, the surface area of the p-side electrode 115 can be increased in addition to the effects of the aforementioned third embodiment, whereby heat radiability of the semiconductor laser element can be improved.

While the p-side electrode 115 (wire bonding portion 115a) of the semiconductor laser element 50 and the lead terminal 83 of the stem 80 are connected with each other through the single Au wire 90 in each of the aforementioned embodiments as shown in FIG. 2, the present invention is not restricted to this but the p-side electrode 115 and the lead terminal 83 may alternatively be connected with each other through a plurality of (e.g., three) Au wires. According to the structure of this second modification, the number of the Au wires connected to the p-side electrode 115 is so increased that heat generated in the semiconductor laser element can be effectively radiated from the semiconductor laser device through the plurality of Au wires and the lead terminal 83, in addition to the effects of the aforementioned embodiments and the aforementioned modification.

What is claimed is:

1. A semiconductor laser device comprising:
   a semiconductor laser element having a warp along a first direction corresponding to an extensional direction of a cavity;
   an electrode layer formed on a surface of a concave side of said warp of said semiconductor laser element; and
   a base to which a convex side of said warp of said semiconductor laser element is fixed, wherein
   said electrode layer has a first portion provided along said first direction and a wire bonding portion protruding from either around a light emitting end or around a light reflecting end of said cavity of said first portion in a second direction intersecting with said first direction in plan view,
   said semiconductor laser element is so fixed to said base that a distance between said convex side of said warp of said semiconductor laser element and said base varies with said warp of said semiconductor laser element along said first direction and that said distance either around said light emitting end or around said light reflecting end of said cavity of said first portion is the largest, and
   said semiconductor laser element has a warp along said second direction.

2. The semiconductor laser device according to claim 1, wherein
   said semiconductor laser element includes a substrate and a semiconductor laser element portion formed on a surface of said substrate,
   said semiconductor laser element is fixed to said base through a fusible layer such that a side provided with said substrate is directed toward said base, and
   said fusible layer is so formed that a thickness thereof varies with said warp of said semiconductor laser element on a region held between said substrate and said base.

3. The semiconductor laser device according to claim 1, wherein
   said fusible layer is a conductive bonding layer made of solder.

4. The semiconductor laser device according to claim 1, wherein
   said semiconductor laser element includes a semiconductor laser element portion having a nitride-based semiconductor layer.

5. The semiconductor laser device according to claim 1, wherein
   said wire bonding portion is provided around a region corresponding to said light emitting end.

6. The semiconductor laser device according to claim 5, wherein
   a lower surface of said semiconductor laser element around said light reflecting end is arranged substantially parallel to an upper surface of said base.

7. The semiconductor laser device according to claim 1, wherein
   said wire bonding portion is provided around a region corresponding to said light reflecting end.

8. The semiconductor laser device according to claim 7, wherein
   a lower surface of said semiconductor laser element around said light emitting end is arranged substantially parallel to an upper surface of said base.

9. The semiconductor laser device according to claim 1, wherein
   said semiconductor laser element is so fixed to said base that said distance varies with said warp of said semiconductor laser element along said second direction.

10. The semiconductor laser device according to claim 9, wherein
    said wire bonding portion is provided around a central portion in said second direction.

11. The semiconductor laser device according to claim 1, wherein
    a plurality of said wire bonding portions are provided along said first direction.

12. The semiconductor laser device according to claim 11, wherein
    each of a plurality of said wire bonding portions is so provided as to protrude from said electrode layer toward one side in said second direction.

13. The semiconductor laser device according to claim 1, wherein
    a ridge portion connected to said electrode layer is formed on an upper surface of said semiconductor laser element, and
    said wire bonding portion is provided on a region other than a region provided with said ridge portion.

14. The semiconductor laser device according to claim 13, wherein
    said ridge portion and said wire bonding portion are formed on opposite sides with a substantially central portion of said semiconductor laser element in a second direction therebetween.

* * * * *